(12) United States Patent
Hoshi

(10) Patent No.: US 11,296,217 B2
(45) Date of Patent: Apr. 5, 2022

(54) SEMICONDUCTOR DEVICE

(71) Applicant: FUJI ELECTRIC CO., LTD., Kawasaki (JP)

(72) Inventor: Yasuyuki Hoshi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/107,113

(22) Filed: Nov. 30, 2020

(65) Prior Publication Data

US 2021/0226053 A1  Jul. 22, 2021

(30) Foreign Application Priority Data

Jan. 17, 2020 (JP) .............................. JP2020-006090

(51) Int. Cl.
*H01L 29/78* (2006.01)
*H01L 29/16* (2006.01)

(52) U.S. Cl.
CPC ...... *H01L 29/7811* (2013.01); *H01L 29/1608* (2013.01); *H01L 29/7808* (2013.01); *H01L 29/7813* (2013.01); *H01L 29/7815* (2013.01)

(58) Field of Classification Search
CPC ............. H01L 29/7811; H01L 29/1608; H01L 29/0619; H01L 29/0623; H01L 29/0661; H01L 29/0878; H01L 29/1095; H01L 29/16; H01L 29/66068; H01L 29/66734; H01L 29/7397; H01L 29/7804; H01L 29/7808; H01L 29/7813; H01L 29/7815; H01L 29/866
See application file for complete search history.

(56) References Cited

U.S. PATENT DOCUMENTS

| 2012/0025306 A1* | 2/2012 | Tomita | H01L 29/41741 257/334 |
| 2013/0075760 A1* | 3/2013 | Takaya | H01L 29/0619 257/77 |
| 2015/0295079 A1 | 10/2015 | Nakano et al. | |
| 2017/0111037 A1* | 4/2017 | Shiigi | H01L 29/1608 |

FOREIGN PATENT DOCUMENTS

| JP | H04-326768 A | 11/1992 |
| JP | 2013-232533 A | 11/2013 |
| JP | 2015-018950 A | 1/2015 |

* cited by examiner

*Primary Examiner* — Eric A. Ward
(74) *Attorney, Agent, or Firm* — Rabin & Berdo, P.C.

(57) ABSTRACT

A semiconductor device includes an active region configured by a first MOS structure region and a second MOS structure region, a gate ring region surrounding a periphery of the active region, a first ring region surrounding a periphery of the gate ring region, a second ring region surrounding a periphery of the first ring region, and a termination region surrounding a periphery of the second ring region. The semiconductor device has first first-electrodes in the first MOS structure region, second first-electrodes in the second MOS structure region, a third first-electrode in the first ring region, and a fourth first-electrode in the second ring region. The third first-electrode has a potential equal to that of the second first-electrodes, and the fourth first-electrode has a potential equal to that of the first first-electrodes.

10 Claims, 14 Drawing Sheets

US 11,296,217 B2

SEMICONDUCTOR DEVICE

CROSS REFERENCE TO RELATED APPLICATIONS

This application is based upon and claims the benefit of priority of the prior Japanese Patent Application No. 2020-006090, filed on Jan. 17, 2020, the entire contents of which are incorporated herein by reference.

BACKGROUND OF THE INVENTION

1. Field of the Invention

Embodiments of the invention relate to a semiconductor device.

2. Description of the Related Art

Silicon (Si) is used as a material for power semiconductor devices that control high voltage and/or large current. There are several types of power semiconductor devices such as bipolar transistors, insulated gate bipolar transistors (IGBTs), and metal oxide semiconductor field effect transistors (MOSFETs). These devices are selectively used according to an intended purpose.

For example, bipolar transistors and IGBTs have high current density compared to MOSFETs and can be adapted for large current but cannot be switched at high speeds. In particular, the limit of switching frequency is about several kHz for bipolar transistors and about several tens of kHz for IGBTs. On the other hand, power MOSFETs have low current density compared to bipolar transistors and IGBTs and are difficult to adapt for large current but can be switched at high speeds up to about several MHz.

There is a strong demand in the market for large-current, high-speed power semiconductor devices. Thus, IGBTs and power MOSFETs have been intensively developed and improved, and the performance of power devices has substantially reached the theoretical limit determined by the material. In terms of power semiconductor devices, semiconductor materials to replace silicon have been investigated and silicon carbide (SiC) has been focused on as a semiconductor material enabling fabrication (manufacture) of a next-generation power semiconductor device having low ON voltage, high-speed characteristics, and high-temperature characteristics.

SiC is a very stable material chemically, has a wide bandgap of 3 eV, and can be used very stably as a semiconductor material even at high temperatures. Further, SiC has a critical electric field strength that is at least ten times that of silicon and therefore, is expected to be a semiconductor material capable of sufficiently reducing ON resistance. Such characteristics of silicon carbide are also applicable to other semiconductors having a bandgap wider than that of silicon, such as, for example, gallium nitride (GaN). Therefore, use of a wide bandgap semiconductor enables high withstand voltage for semiconductor devices A structure of a conventional silicon carbide semiconductor device will be described taking a trench-type vertical MOSFET as an example. FIG. 16 is a top view of the structure of the conventional silicon carbide semiconductor device. As depicted in FIG. 16, a silicon carbide semiconductor device 1600 includes, at an outer periphery of an active region 1150 through which a main current passes, an edge termination region 1168 that sustains breakdown voltage and is provided surrounding a periphery of the active region 1150. In the active region 1150, a gate electrode pad 1100 that is electrically connected to gate electrodes and a source electrode pad 1015 that is electrically connected to source electrodes are provided. Further, between the active region 1150 and the edge termination region 1168, a gate ring region 1160 in which wiring for connecting gate electrodes and the gate electrode pad 1100 is formed is provided.

To further improve reliability of a silicon carbide semiconductor device, a semiconductor device has been proposed in which on a single semiconductor substrate having the silicon carbide semiconductor device 1600, a high-function region 1400 such as a current sensing region, a temperature sensing region, and an overcurrent current protecting region is disposed. In an instances of a high-function structure, to stably form the high-function region 1400, a region in which only the high-function region 1400 is disposed is provided in the active region 1150, separate from unit cells of a main semiconductor element and adjacent to the edge termination region 1168. The active region 1150 is a region through which a main current flows during an ON state of the main semiconductor element. The edge termination region 1168 is a region for mitigating electric field on a front side of the semiconductor substrate and sustaining a breakdown voltage (withstand voltage). The breakdown voltage is a voltage limit at which no erroneous operation or destruction of an element occurs.

In the current sensing region, an active region 1230 thereof having a structure similar to that of the active region 1150 and an electrode pad 1202 of the current sensing region for detecting current are provided. The temperature sensing region has a function of detecting the temperature of a semiconductor chip, using diode temperature characteristics, and an anode electrode pad 1201A of the temperature sensing region and a cathode electrode pad 1201B of the temperature sensing region are provided in the temperature sensing region.

FIG. 17 is a cross-sectional view of the structure of the conventional silicon carbide semiconductor device, along cutting line A-A' in FIG. 16. FIG. 17 is a cross-sectional view of the structure of the silicon carbide semiconductor device in which a conventional trench-type MOSFET is used. In the silicon carbide semiconductor device 1600, an n-type silicon carbide epitaxial layer 1002 is deposited on a front surface of an $n^+$-type silicon carbide substrate 1001. In the active region 1150, n-type high-concentration regions 1005 are provided in the n-type silicon carbide epitaxial layer 1002, at a first surface thereof opposite a second surface thereof facing the $n^+$-type silicon carbide substrate 1001. Further, in the n-type high-concentration regions 1005, second $p^+$-type base regions 1004 are selectively provided so as to cover entire bottoms of trenches 1018. First $p^+$-type base regions 1003 are selectively provided in the n-type high-concentration regions 1005, at a first surface thereof opposite a second surface thereof facing the $n^+$-type silicon carbide substrate 1001.

Further, in the active region 1150 of the conventional the silicon carbide semiconductor device 1600, a p-type base layer 1006, $n^+$-type source regions 1007, $p^{++}$-type contact regions 1008, gate insulating films 1009, gate electrodes 1010, an interlayer insulating film 1011, source electrodes 1013, a back electrode 1014, the trenches 1018, the source electrode pad 1015, and a drain electrode pad (not depicted) are provided.

The source electrodes 1013 are provided on the $n^+$-type source regions 1007 and the $p^{++}$-type contact regions 1008; the source electrode pad 1015 is a multilayer film in which a first TiN film 1025, a first Ti film 1026, a second TiN film 1027, a second Ti film 1028, and an Al alloy film 1029 are sequentially stacked. Further, on tops of the source electrodes 1013, plating films 1016, solder 1017, external terminal electrodes 1019, first protective films 1021, and second protective films 1023 are provided.

Further, in the gate ring region 1160 of the conventional the silicon carbide semiconductor device 1600, the first $p^+$-type base regions 1003, the p-type base layer 1006, and the $p^{++}$-type contact regions 1008 are provided. On the $p^{++}$-type contact regions 1008, an insulating film 1530, the gate electrodes 1010, the interlayer insulating film 1011, a gate wiring electrode 1030, and second protective films 1023 are provided.

Further, in the edge termination region 1168 of the conventional the silicon carbide semiconductor device 1600, spanning an entire area thereof, the p-type base layer 1006 and the $p^{++}$-type contact regions 1008 are removed, forming a recess where the edge termination region 1168 is lower than the active region 1150, and at a bottom of the recess, the n-type silicon carbide epitaxial layer 1002 is exposed.

Further, in the edge termination region 1168, a JTE structure is provided in which multiple $p^+$-type regions (herein, two including a first JTE region 1163, a second JTE region 1165) are disposed adjacently to one another. Further, an $n^+$-type stopper region 1167 that functions as a channel stopper is provided on an outer side (side closest to a chip end) of the JTE structure.

The first JTE region 1163 and the second JTE region 1165 are each selectively provided in portions of the n-type silicon carbide epitaxial layer 1002 exposed at the bottom of the recess. When high voltage is applied, high voltage in a lateral direction other than that in the active region 1150 is secured by pn junctions between the first JTE region 1163, the second JTE region 1165, and the n-type silicon carbide epitaxial layer 1002.

Further, in a commonly known semiconductor device, gate electrodes and source electrodes are connected through a Zener diode region disposed in the semiconductor device, in a peripheral region thereof, and $n^+$-type semiconductor regions and $p^+$-type semiconductor regions are disposed alternating one another from an inner periphery of the Zener diode region toward an outer periphery, whereby the pn junction surface area of the Zener diode is increased and the gate electrodes are assuredly protected from overvoltage (for example, refer to Japanese Laid-Open Patent Publication No. 2015-018950).

Further, in a commonly known semiconductor device, at a peripheral portion of a source pad, a removal region surrounding a center region of the source pad is formed along an outer peripheral region (for example, refer to Japanese Laid-Open Patent Publication No. 2013-232533).

Further, in a commonly known semiconductor device, Zener diodes are provided between a gate terminal and a source terminal, and between a gate terminal and a sensing terminal, whereby the semiconductor device is capable of protecting an element without affecting detection current by a sensing terminal for detecting current (for example, for example, refer to Japanese Laid-Open Patent Publication No. H4-326768).

SUMMARY OF THE INVENTION

According to an embodiment of the invention, a semiconductor device having, in a top view thereof, an active region configured by a first MOS (metal oxide semiconductor) structure region and a second MOS structure region, a gate ring region surrounding a periphery of the active region, a first ring region surrounding a periphery of the gate ring region, a second ring region surrounding a periphery of the first ring region, and a termination region surrounding a periphery of the second ring region, includes: a semiconductor substrate of a first conductivity type, having a front surface and a back surface; a first semiconductor layer of the first conductivity type, provided on the front surface of the semiconductor substrate and having an impurity concentration lower than that of the semiconductor substrate, the first semiconductor layer having a first surface and a second surface that are opposite to each other, the second surface thereof facing the semiconductor substrate; in the active region and the gate ring region: a first second-semiconductor layer of a second conductivity type, provided on the first surface of the first semiconductor layer and having a first surface and a second surface that are opposite to each other, the second surface thereof facing the semiconductor substrate; in the first MOS structure region: a plurality of first first-semiconductor regions of the first conductivity type, selectively provided in the first second-semiconductor layer at the first surface thereof, a plurality of first gate insulating films each having a first surface and a second surface that are opposite to each other, the second surface thereof being in contact with the first second-semiconductor layer, a plurality of first gate electrodes respectively provided on the first surfaces of the first gate insulating films, and a plurality of first first-electrodes provided on the first surface of the first second-semiconductor layer and surfaces of the first first-semiconductor regions; in the second MOS structure region: a second second-semiconductor layer of the second conductivity type, provided on the first surface of the first semiconductor layer and having a first surface and a second surface that are opposite to each other, the second surface thereof facing the semiconductor substrate, a plurality of second first-semiconductor regions of the first conductivity type, selectively provided in the second second-semiconductor layer at the first surface thereof, a plurality of second gate insulating films each having a first surface and a second surface that are opposite to each other, the second surface thereof being in contact with the second second-semiconductor layer, a plurality of second gate electrodes respectively provided on the first surfaces of the second gate insulating films, and a plurality of second first-electrodes provided on the first surface of the second second-semiconductor layer and surfaces of the second first-semiconductor regions; in the gate ring region: an insulating film having a first surface and a second surface that are opposite to each other, the second surface thereof being in contact with the first second-semiconductor layer, a third gate electrode provided on the first surface of the insulating film, and a gate wiring electrode provided on the third gate electrode; in the first ring region: a third second-semiconductor layer of the second conductivity type, provided on the first surface of the first semiconductor layer, and a third first-electrode provided on a surface of the third second-semiconductor layer; in the second ring region: a fourth second-semiconductor layer of the second conductivity type, provided on the first surface of the first semiconductor layer, and a fourth first-electrode provided on a surface of the fourth second-semiconductor layer; and a second electrode provided on the back surface of the semiconductor substrate. The third first-electrode has a potential thereof equal to that of the second first-electrodes, and the fourth first-electrode has a potential thereof equal to that of the first first-electrodes.

Objects, features, and advantages of the present invention are specifically set forth in or will become apparent from the

DETAILED DESCRIPTION OF THE INVENTION

Figure 17:
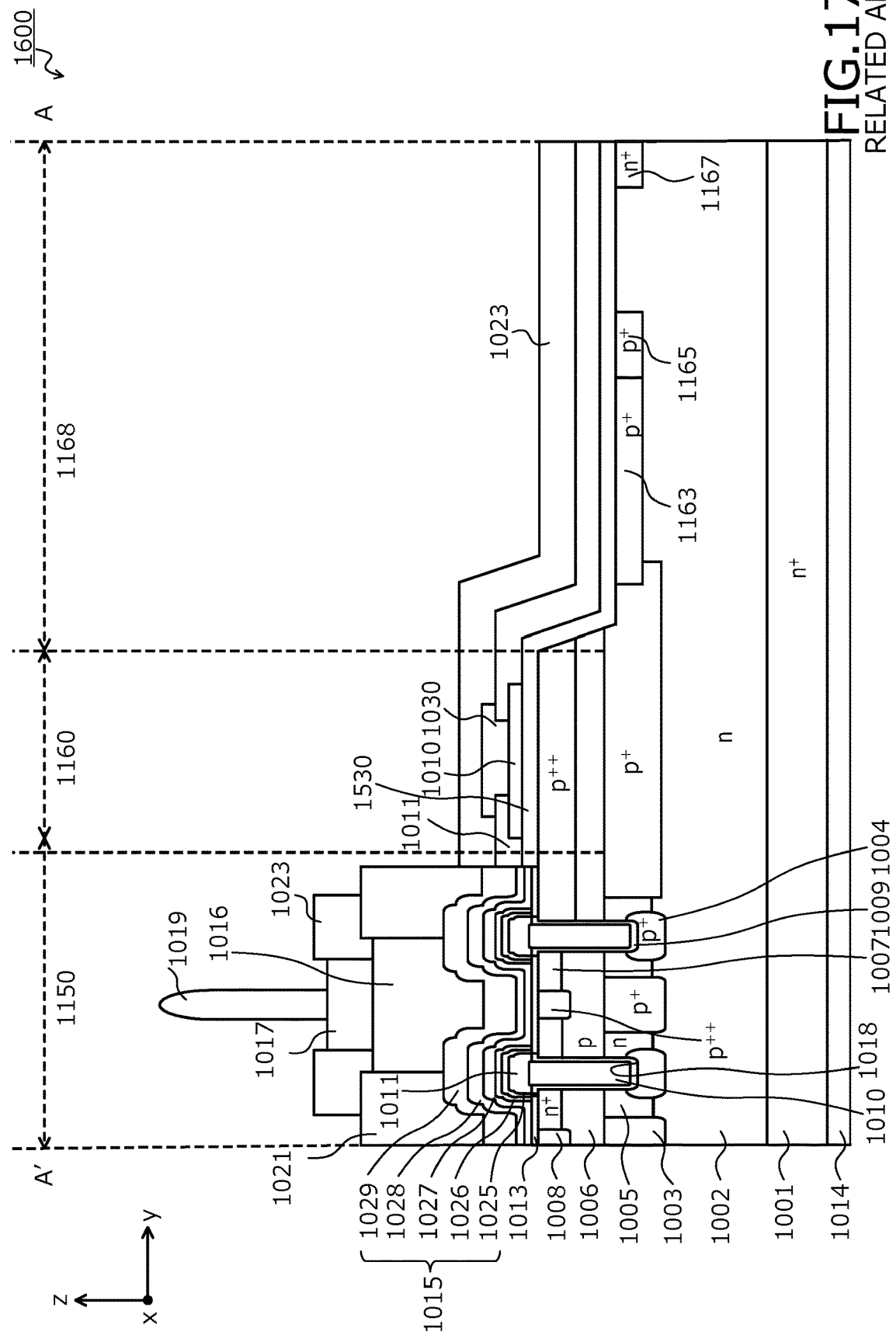
FIG. 17 is a cross-sectional view of the structure of the conventional silicon carbide semiconductor device, along cutting line A-A' in FIG. 16.

First, problems associated with the conventional techniques will be discussed. In the conventional silicon carbide semiconductor device described above (refer to FIG. 17), a wide bandgap semiconductor is used as a semiconductor material and therefore, compared to an instance in which silicon is used as a semiconductor material, the width of the edge termination region 1168 may be reduced by about 1/5 to 1/2. Additionally, the thickness of the edge termination region 1168 may be reduced by at least 1/2. Therefore, by reducing the width of the edge termination region 1168 and/or reducing the thickness of the edge termination region 1168, reduction of MOSFET ON resistance (RonA) is possible.

However, when the width of the edge termination region 1168 is reduced and/or the thickness of the edge termination region 1168 is reduced, the capacitance (pn junction capacitance) of a depletion layer that spreads in a direction parallel to the front surface of the semiconductor substrate (lateral direction), toward the chip ends, from pn junctions between the p-type base layer 1006 and the n-type high-concentration regions 1005 when the MOSFET is OFF increases. Therefore, during switching of the MOSFET (particularly when the MOSFET is OFF), for example, when voltage between the drain and source varies briefly due to noise such as surges (hereinafter, dv/dt surges), displacement current flowing through the pn junction capacitance increases significantly. In particular, the current value of displacement current flowing during charging/discharging of the pn junction capacitance is double the volume for the current value in an instance in which silicon is used as a semiconductor material, minus the edge termination region 1168.

When the MOSFET is OFF, displacement current due to holes (hereinafter, simply, hole current) flows from the edge termination region 1168 toward the active region 1150, and is lead out to the source electrodes 1013 from the $p^{++}$-type contact regions 1008 of the active region 1150. However, while the active region 1230 of the current sensing region is structured similarly to the active region 1150, the $n^{+}$-type source regions 1007, etc. are not disposed in a lower region of an electrode pad such as the gate electrode pad 1100 of a periphery of the current sensing region. As a result, in the high-function region 1400, the arithmetic area of the $p^{++}$-type contact regions 1008 is greater than that of the active region 1150. Therefore, a problem arises in that in the active region 1230 of the current sensing region, the current capacity flowing in the $p^{++}$-type contact regions 1008 increases, electric field increases, and electrostatic discharge (ESD) tolerance of the active region 1230 of the current sensing region decreases.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

Figure 1:
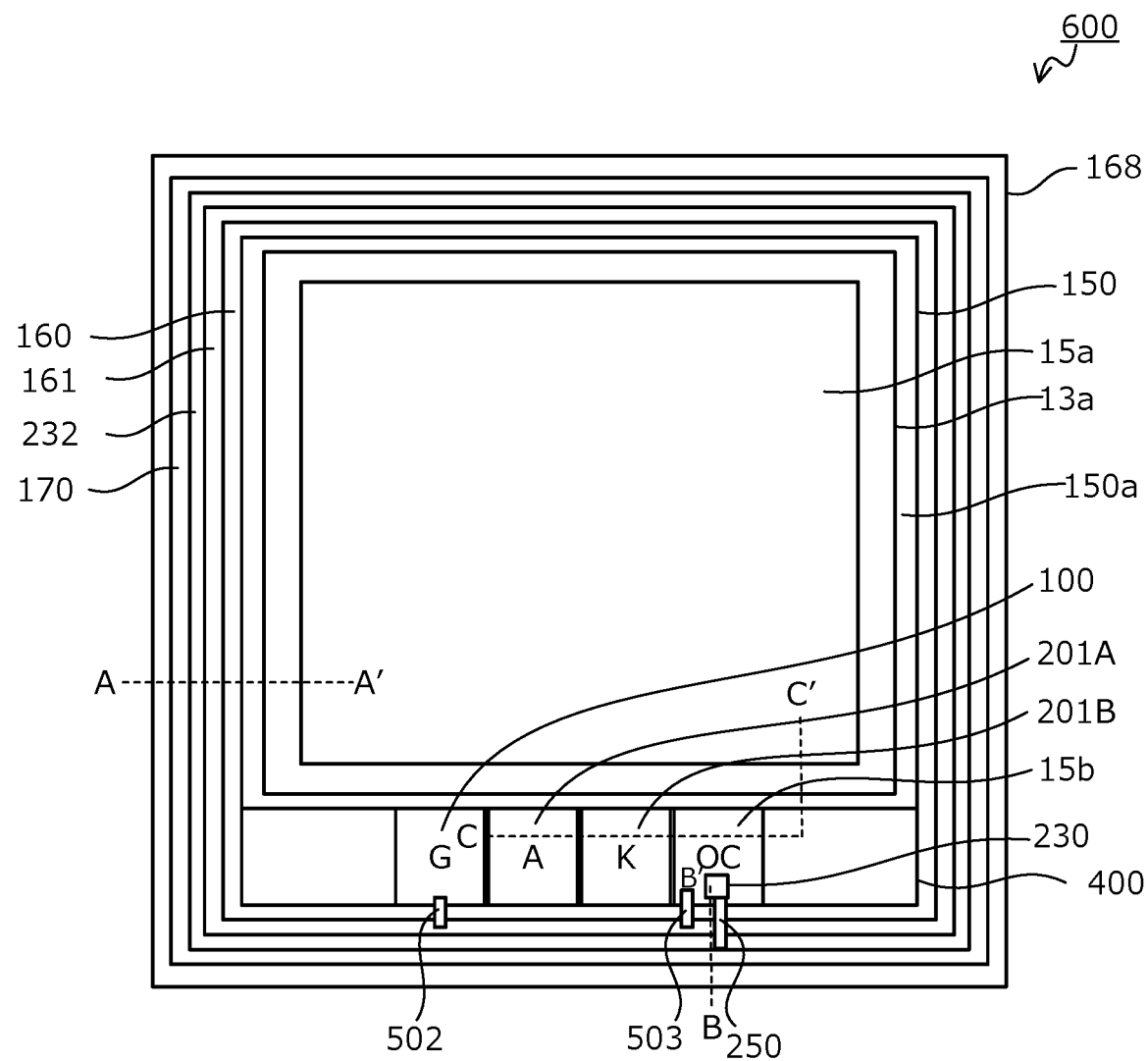
FIG. 1 is a top view of a structure of a silicon carbide semiconductor device according to a first embodiment.

A semiconductor device according to a first embodiment is configured using a semiconductor having a bandgap that is wider than that of silicon (Si) (hereinafter, wide bandgap semiconductor). A structure of the semiconductor device according to the first embodiment will be described taking, as an example, an instance in which, for example, silicon carbide (SiC) is used as a wide bandgap semiconductor. FIG. 1 is a top view of a structure of a silicon carbide semiconductor device according to a first embodiment. FIG. 1 depicts a layout of regions and electrode pads of each element disposed on a semiconductor substrate (semiconductor chip).

A silicon carbide semiconductor device 600 depicted in FIG. 1 has a main semiconductor element 42 (refer to FIGS. 2, 4) and, for example, high-functioning regions such as a current sensing region 37a (refer to FIGS. 3, 4), a temperature sensing region 35a (refer to FIG. 4), an overcurrent current protecting region (not depicted), and an arithmetic circuit region (not depicted) as circuit regions for protecting and controlling the main semiconductor element 42, on a single semiconductor substrate that contains silicon carbide. The main semiconductor element 42 is a trench-type MOSFET through which drift current flows in a vertical direction (depth direction z of the semiconductor substrate) during an ON state, the main semiconductor element 42 performs a main operation and is configured by multiple unit cells (functional units (not depicted)) disposed adjacent to one another.

The main semiconductor element 42 is provided with an effective region (region functioning as MOS gates) 150a of an active region 150. The effective region 150a of the active region 150 is a region through which current flows when the main semiconductor element 42 is in an ON state and surrounds a gate ring region 160. In the effective region 150a of the active region 150, first source electrodes 13a of the main semiconductor element 42 are provided on a front surface of the semiconductor substrate. The first source electrodes 13a, for example, cover substantially an entire area of the effective region 150a of the active region 150. Further, on front surfaces of the first source electrodes 13a, for example, a first source electrode pad 15a having a rectangular planar shape is provided.

An edge termination region 168 is a region between the active region 150 and side surfaces of the chip (semiconductor substrate), for mitigating electric field of a front side of the semiconductor substrate and sustaining a breakdown voltage (withstand voltage). In the edge termination region 168, for example, a withstand voltage structure (not depicted) such as a guard ring, p-type regions configuring a later-described junction termination extension (JTE) structure, a field plate, a RESURF, etc. is disposed.

Further, in the active region 150, a high-function region 400 is provided adjacent to the gate ring region 160. The high-function region 400, for example, has a substantially rectangular planar shape. In the high-function region 400, high-functioning regions such as the current sensing region 37a, the overcurrent current protecting region (not depicted), and the arithmetic circuit region (not depicted) are provided. In FIG. 1, while only the current sensing region 37a is depicted as a high-functioning region, high-functioning regions other than the current sensing region 37a may be disposed in the high-function region 400.

The current sensing region 37a has a function of detecting overcurrent (OC) flowing in the main semiconductor element 42. The current sensing region 37a is disposed beneath (in the depth direction z of the semiconductor substrate) a second source electrode pad 15b of the current sensing region 37a, and is a vertical MOSFET having, in an active region 230 of the current sensing region 37a, a few unit cells of a configuration similar to that of the unit cells of the main semiconductor element 42.

Further, in the high-function region 400, on the front surface of the semiconductor substrate, along a border between the active region 150 and the edge termination region 168 and separate from the first source electrodes 13a and the edge termination region 168, a gate electrode pad 100 of the main semiconductor element 42, an anode electrode pad 201A of the temperature sensing region 35a, the cathode electrode pad 201B of the temperature sensing region 35a, and the second source electrode pad 15b of the current sensing region 37a are provided adjacent to one another. These electrode pads, for example, have substantially rectangular planar shapes.

The temperature sensing region 35a has a function of detecting temperature. Therefore, the temperature sensing region 35a is provided in the effective region 150a of the active region 150. For example, in the temperature sensing region 35a, a diode formed by a later-described p-type polysilicon layer 81 and an n-type polysilicon layer 82 is disposed (refer to FIG. 4). Forward voltage Vf of the diode varies according to temperature and the higher is the temperature, the lower is the forward voltage Vf. Therefore, a relationship between temperature and the forward voltage Vf is obtained in advance and the forward voltage Vf of the diode during operation of the MOSFET in the effective region 150a is measured, thereby enabling the temperature of the silicon carbide semiconductor device 600 to be measured.

The anode electrode pad 201A of the temperature sensing region 35a is electrically connected to an anode electrode 84 provided on the p-type polysilicon layer 81, and the cathode electrode pad 201B of the temperature sensing region 35a is electrically connected to a cathode electrode 85 provided on the n-type polysilicon layer 82.

The gate electrode pad 100 is electrically connected to first gate electrodes 10a of all of the unit cells of the main semiconductor element 42, via a gate wiring electrode 30 (refer to FIG. 2) provided in the gate ring region 160. The gate ring region 160 is provided between the active region 150 and the edge termination region (termination region) 168, so as to surround a periphery of the active region 150.

Further, between the gate ring region 160 and the edge termination region 168, a Zener diode region 161 is provided so as to surround the gate ring region 160. In the Zener diode region 161, a Zener diode is disposed. The Zener diode is connected to a third source electrode 13c of a current sensing source ring region 232 described hereinafter and second source electrodes 13b of the current sensing region 37a described hereinafter, by short-circuit regions 502, 503, and prevents application of overvoltage between these electrodes. In the first embodiment, the current sensing source ring region 232 is provided surrounding the active region 150 and therefore, the Zener diode region 161 is disposed adjacent to the current sensing source ring region 232, the arithmetic area of the Zener diode region 161 may be increased, ESD tolerance of the current sensing region 37a is improved, and breakdown tolerance during switching may be improved.

Further, the current sensing source ring region (first ring region) 232 is provided surrounding the Zener diode region 161. In the current sensing source ring region 232, the third source electrode 13c is provided. The third source electrode 13c is connected to a later-described third p-type base layer 6c and second p-type base layers 6b by a short-circuit region 250 and is thereby connected to the second p-type base layers 6b and fixed at a potential (source potential) of the second source electrodes 13b of the current sensing region 37a.

Further, a main source ring region (second ring region) 170 is provided surrounding the current sensing source ring region 232. The main source ring region 170, as described hereinafter, a fourth source electrode 13d is provided connecting a later-described fourth p-type base layer 6d and first p-type base layers 6a, and is thereby fixed at a potential (source potential) of the first source electrodes 13a of the later-described effective region 150a. The main source ring region 170 has a function of leading out, via the fourth p-type base layer 6d, hole current that flows into the active region 150 from the edge termination region 168 when the main semiconductor element 42 is OFF. The main source ring region 170 surrounds the current sensing source ring region 232 and the gate ring region 160 and therefore, the hole current that flows in from the edge termination region 168 is lead out via the fourth p-type base layer 6d, thereby enabling effects on the current sensing source ring region 232 and the active region 150 to be eliminated.

Figure 2:
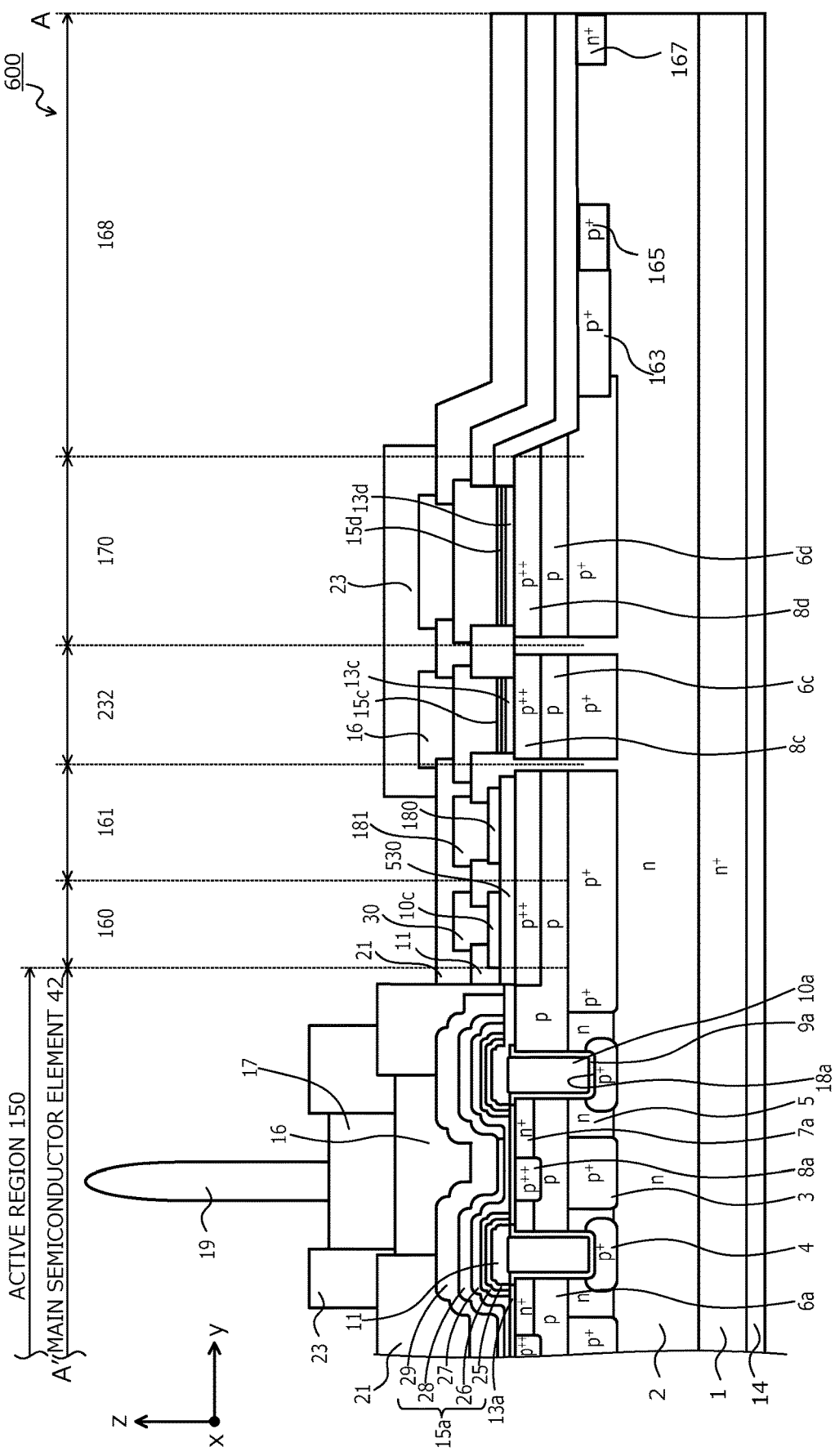
FIG. 2 is a cross-sectional view of the structure of the silicon carbide semiconductor device according to the first embodiment, along cutting line A-A' in FIG. 1.
Figure 3:
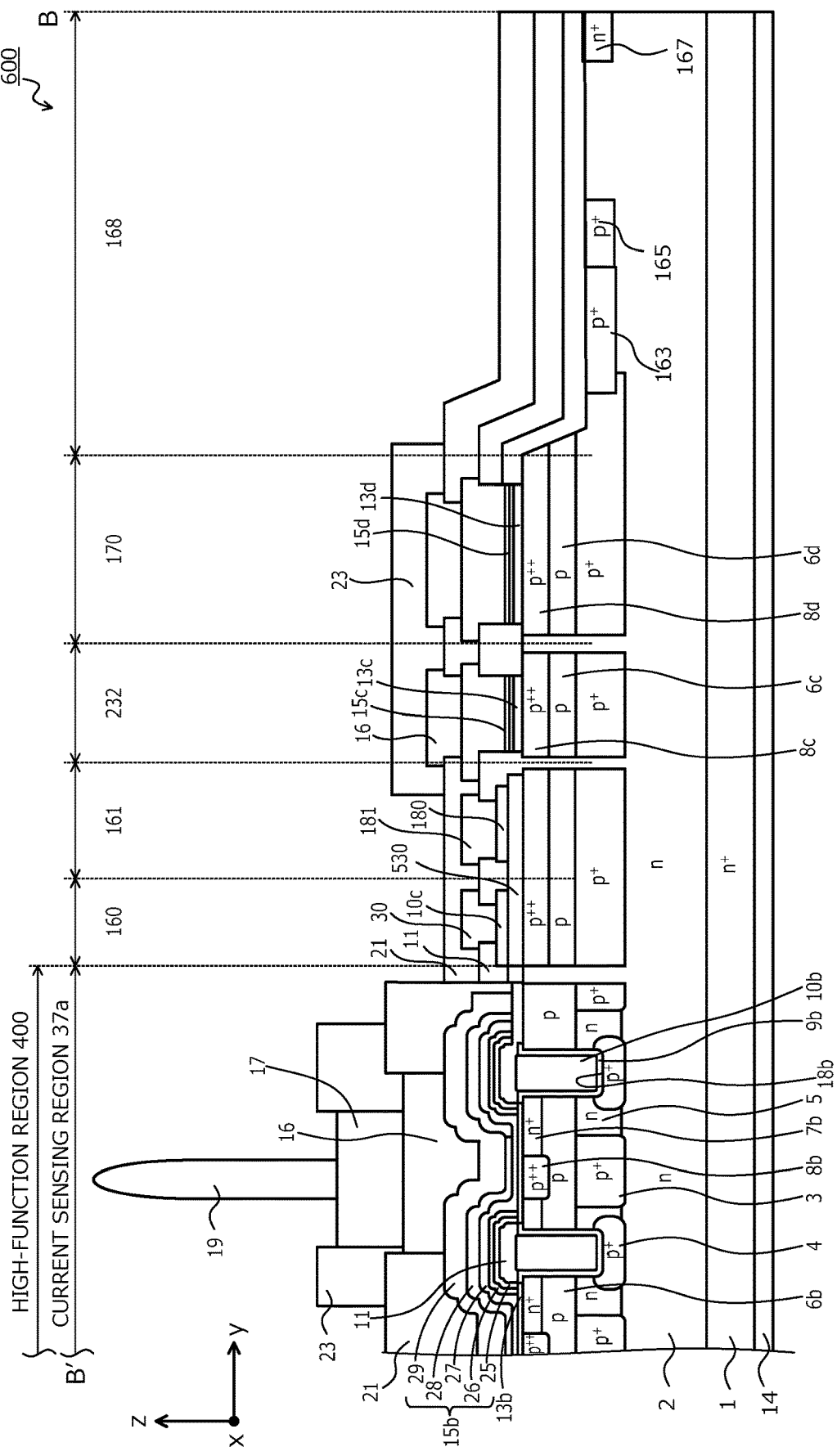
FIG. 3 is a cross-sectional view of the structure of the silicon carbide semiconductor device according to the first embodiment along cutting line B-B' in FIG. 1.
Figure 4:
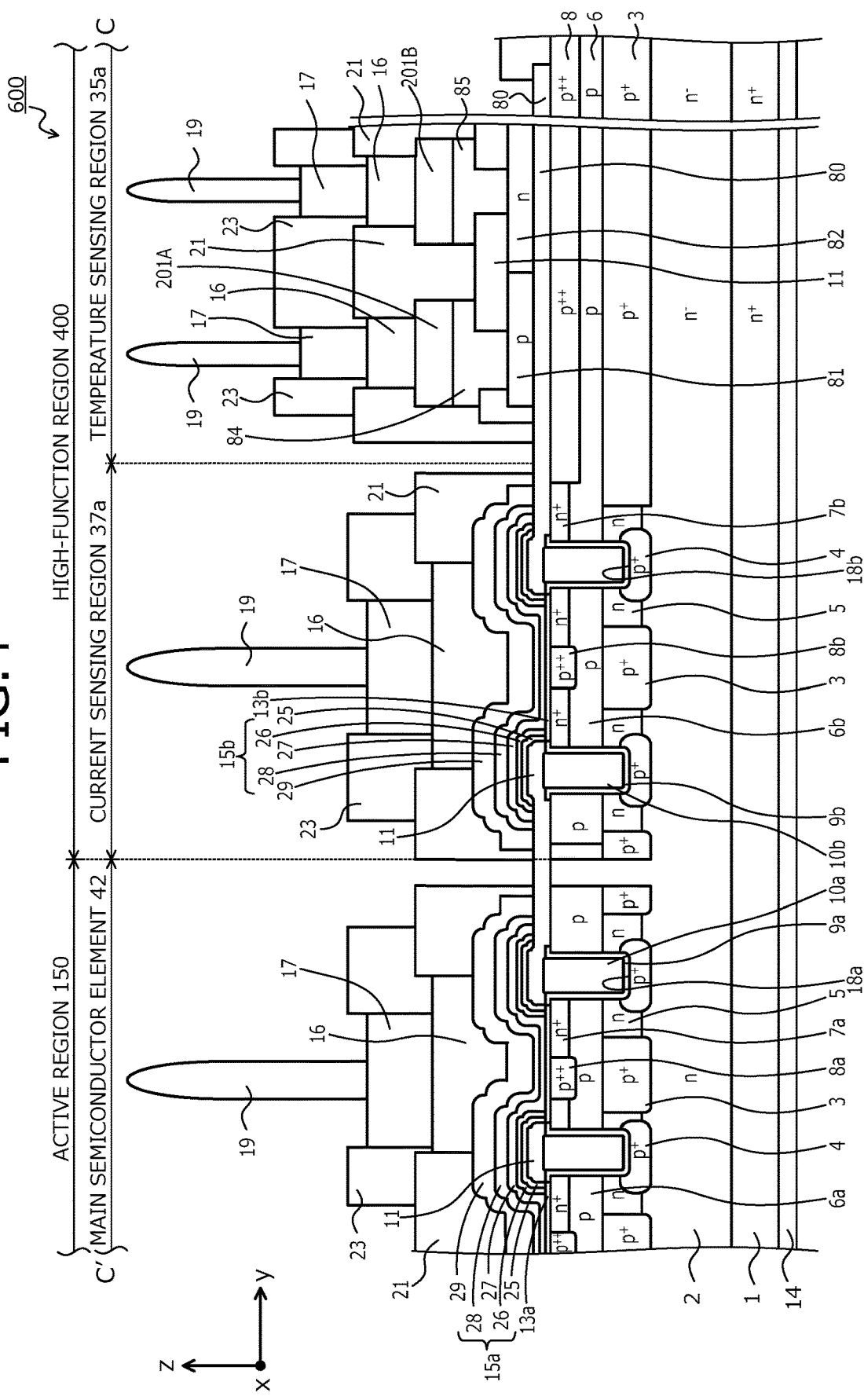
FIG. 4 is a cross-sectional view of the silicon carbide semiconductor device according to the first embodiment along cutting line C-C' in FIG. 1.

Next, an example of a cross-sectional view of the structure of the active region 150, the gate ring region 160, the Zener diode region 161, the current sensing source ring region 232, the main source ring region 170, the edge termination region 168, the current sensing region (second MOS structure region) 37a, and the temperature sensing region 35a described above will be described. FIG. 2 is a cross-sectional view of the structure of the silicon carbide semiconductor device according to the first embodiment, along cutting line A-A' in FIG. 1. FIG. 3 is a cross-sectional view of the structure of the silicon carbide semiconductor device according to the first embodiment along cutting line B-B' in FIG. 1. FIG. 4 is a cross-sectional view of the silicon carbide semiconductor device according to the first embodiment along cutting line C-C' in FIG. 1. Only two adjacent unit cells of the main semiconductor element 42 are depicted while other unit cells of the main semiconductor element 42 adjacent thereto and closer to a center portion of the chip (semiconductor substrate) are not depicted.

The main semiconductor element 42 is a trench-type MOSFET that has MOS gates having a trench gate structure provided on a front side of the semiconductor substrate (side thereof having the first p-type base layers 6a). In the trench-type MOSFET, on a first main surface (front surface), for example, a (0001)-plane (Si-face), of an $n^+$-type silicon carbide substrate (semiconductor substrate of a first conductivity type) 1, an n-type silicon carbide epitaxial layer (first semiconductor layer of the first conductivity type) 2 is deposited. The $n^+$-type silicon carbide substrate 1 is a silicon carbide single crystal substrate doped with, for example, nitrogen (N). The n-type silicon carbide epitaxial layer 2 is a low-concentration n-type drift region having an impurity concentration lower than an impurity concentration of the $n^+$-type silicon carbide substrate 1 and doped with, for example, nitrogen.

As depicted in FIGS. 2 to 4, on a second main surface (back surface, i.e., back surface of a silicon carbide semiconductor base) of the $n^+$-type silicon carbide substrate 1, a back electrode 14 is provided. The back electrode 14 configures a drain electrode. On the surface of the back electrode 14 a drain electrode pad (not depicted) is provided.

As depicted in FIGS. 2 and 4, in the main semiconductor element (first MOS structure region) 42, in the n-type silicon carbide epitaxial layer 2, at a first surface thereof opposite a second surface thereof facing the $n^+$-type silicon carbide substrate 1, n-type high-concentration regions 5 may be provided. The n-type high-concentration regions 5 are a high-concentration n-type drift layer having an impurity concentration lower than the impurity concentration of the $n^+$-type silicon carbide substrate 1 and higher than the impurity concentration of the n-type silicon carbide epitaxial layer 2.

On first surfaces of the n-type high-concentration regions 5 (in an instance in which the n-type high-concentration regions 5 are not provided, the n-type silicon carbide epitaxial layer 2, hereinafter, simply "(2)"), opposite second surfaces thereof facing the $n^+$-type silicon carbide substrate 1, the first p-type base layers (first second-semiconductor layers of the second conductivity type) 6a are provided. Hereinafter, the $n^+$-type silicon carbide substrate 1, the n-type silicon carbide epitaxial layer 2, and the first p-type base layers 6a collectively are the silicon carbide semiconductor base.

In the silicon carbide semiconductor base, at a first main side thereof (side having the first p-type base layers 6a), a trench structure is formed in a striped pattern. In particular, first trenches (first trenches) 18a penetrate the first p-type base layers 6a from first surfaces of the first p-type base layers 6a (surface on the first main side of the silicon carbide semiconductor base), opposite second surfaces thereof facing the $n^+$-type silicon carbide substrate 1 and reach the n-type high-concentration regions 5(2). Along inner walls of the first trenches 18a, first gate insulating films (first gate insulating films) 9a are formed on bottoms and sidewalls of the first trenches 18a, and the first gate electrodes (first gate electrodes) 10a having a shape of a stripe are formed on the first gate insulating films 9a in the first trenches 18a. The first gate electrodes 10a are insulated from the n-type high-concentration regions 5(2) and the first p-type base layers 6a by the first gate insulating films 9a. Portions of the first gate electrodes 10a protrude toward the later-described first source electrode pad 15a, from tops of the first trenches 18a.

In surface layers of the n-type high-concentration regions 5(2), on first surfaces thereof (the first main side of the silicon carbide semiconductor base), opposite second surfaces thereof facing the $n^+$-type silicon carbide substrate 1, first $p^+$-type base regions 3 may be selectively provided. Beneath the first trenches 18a, second $p^+$-type base regions 4 may be provided, the second $p^+$-type base regions 4 having a width that is wider than that of the first trenches 18a. The first $p^+$-type base regions 3 and the second $p^+$-type base regions 4, for example, are doped with aluminum.

Portions of the first $p^+$-type base regions 3 may extend toward the first trenches 18a, whereby the second $p^+$-type base regions 4 are connected to the first $p^+$-type base regions 3. The portions of the first $p^+$-type base regions 3 may be disposed in a planar layout to repeatedly alternate the n-type high-concentration regions 5(2), along a direction (hereinafter, second direction) x orthogonal to a direction (hereinafter, first direction) y along which the first $p^+$-type base regions 3 and the second $p^+$-type base regions 4 are arranged. For example, a structure in which connection regions where portions of the first $p^+$-type base regions 3 extend toward both of the first trenches 18a adjacent thereto along the first direction y are provided, connected to portions of the second $p^+$-type base regions 4 may be periodically disposed along the second direction x. A reason for this is that holes generated when avalanche breakdown occurs at junctions between the second $p^+$-type base regions 4 and the n-type silicon carbide epitaxial layer 2 are efficiently migrated to the first source electrodes 13a, whereby load on the first gate insulating films 9a is reduced and reliability is increased. For example, the first $p^+$-type base regions 3, the connection regions, the second $p^+$-type base regions 4, as a whole, may have a grid-shape in a plan view.

In the first p-type base layers 6a, at the first surfaces thereof (the first main surface of the silicon carbide semiconductor base), first $n^+$-type source regions (first first-semiconductor regions of the first conductivity type) 7a are selectively provided. Further, first $p^{++}$-type contact regions 8a may be provided. The first n⁺-type source regions 7a are in contact with the first trenches 18a. Further, the first n⁺-type source regions 7a and the first p⁺⁺-type contact regions 8a are in contact with one another.

An interlayer insulating film (interlayer insulating film) 11 is provided on an entire area of the first main side of the silicon carbide semiconductor base so as to cover the first gate electrodes 10a embedded in the first trenches 18a. The first source electrodes (first first-electrodes) 13a are in contact with the first n⁺-type source regions 7a and the first p-type base layers 6a via contact holes opened in the interlayer insulating film 11. In an instance in which the first p⁺⁺-type contact regions 8a are provided, the first n⁺-type source regions 7a and the first p⁺⁺-type contact regions 8a contact one another. The first source electrodes 13a, for example, are NiSi films. The contact holes opened in the interlayer insulating film 11 have a shape of a stripe corresponding to the shape of the first gate electrodes 10a. The first source electrodes 13a are electrically insulated from the first gate electrodes 10a by the interlayer insulating film 11. On the first source electrodes 13a, the first source electrode pad 15a is provided. The first source electrode pad 15a, for example, is formed by a first TiN film 25, a first Ti film 26, a second TiN film 27, a second Ti film 28, and an Al alloy film 29 stacked on one another. Between the first source electrodes 13a and the interlayer insulating film 11, for example, a barrier metal (not depicted) that prevents diffusion of metal atoms from the first source electrodes 13a to the first gate electrodes 10a may be provided.

On top of the first source electrode pad 15a, plating films 16 are selectively provided and on surfaces of the plating films 16, solder 17 is selectively provided. On the solder 17, external terminal electrodes 19 that are a wiring material for externally leading out potential of the first source electrodes 13a are provided. The external terminal electrodes 19 have a needle-like pin-shape and are bonded in an upright position on the first source electrode pad 15a.

Portions of the surface of the first source electrode pad 15a other than those occupied by the plating films 16 are covered by first protective films 21. In particular, the first protective films 21 are provided so as to cover the first source electrode pad 15a and in openings of the first protective films 21, the external terminal electrodes 19 are bonded via the plating films 16 and the solder 17. Borders between the plating films 16 and the first protective films 21 are covered by second protective films 23. The first protective films 21 and the second protective films 23 are, for example, polyimide films.

Further, in the current sensing source ring region 232, the third p-type base layer (third second-semiconductor layer) 6c is provided in the silicon carbide semiconductor base and on the third p-type base layer 6c, a third p⁺⁺-type contact region 8c may be provided. On the third p⁺⁺-type contact region 8c (in an instance in which the third p⁺⁺-type contact region 8c is not provided, the third p-type base layer 6c, hereinafter, simply "(6c)"), the interlayer insulating film 11 is provided. In the interlayer insulating film 11, a contact hole penetrating the interlayer insulating film 11 in the depth direction z and reaching the third p⁺⁺-type contact region 8c (6c) is opened. In the contact hole, a third source electrode (third first-electrode) 13c is embedded. Therefore, similarly to the first source electrodes 13a, the third source electrode 13c is provided on the third p⁺⁺-type contact region 8c (6c). Similarly to the first source electrodes 13a, a third source electrode pad 15c that is a multilayer film in which the first TiN film 25, the first Ti film 26, the second TiN film 27, the second Ti film 28, and the Al alloy film 29 are stacked is provided on the third source electrode 13c.

Here, in FIG. 3, while p-type regions (second p⁺⁺-type contact regions 8b(6b), etc.) provided in a lower portion of the current sensing region 37a and a p-type region (second p⁺⁺-type contact region 8c(6c), etc.) provided in a lower portion of the current sensing source ring region 232 are separated, in the short-circuit region 250, the p-type regions provided in the lower portion of the current sensing region 37a and the p-type region provided in the current sensing source ring region 232 are connected electrically. Therefore, the third source electrode 13c is at a potential equal to that of the second source electrodes 13b. Such a structure enables the potential of the second source electrodes 13b of the current sensing region 37a to be stabilized.

On the surface of the third source electrode pad 15c, the plating films 16 are provided and portions thereof not occupied by the plating films 16 are covered by the first protective films 21. In particular, the first protective films 21 are provided so as to cover the third source electrode pad 15c and in openings of the first protective films 21, the plating films 16 are provided. Portions of the plating films 16 and of the first protective films 21 may be covered by the second protective films 23. The plating films 16 may be provided on an entire area of the third source electrode 13c.

Further, in the gate ring region 160, on the first p⁺⁺-type contact regions 8a of the silicon carbide semiconductor base (in an instance in which the first p⁺⁺-type contact regions 8a are not provided, the first p-type base layers 6a, hereinafter, simply (6a)), a third gate electrode (third gate electrode) 10c is provided via an insulating film 530. The third gate electrode 10c is insulated from the first p⁺⁺-type contact regions 8a(6a) by the insulating film 530. The third gate electrode 10c is covered by the interlayer insulating film 11. In the interlayer insulating film 11, a contact hole that penetrates the interlayer insulating film 11 in the depth direction z and reaches the third gate electrode 10c is opened. In the contact hole, the gate wiring electrode 30 is embedded. The gate wiring electrode 30 electrically connects the first gate electrodes 10a of the main semiconductor element 42 to the gate electrode pad 100. Further, on the interlayer insulating film 11 and the gate wiring electrode 30, the first protective films 21 are provided.

In the edge termination region 168, spanning an entire area thereof, the p-type regions are removed, forming in the silicon carbide semiconductor base at the front surface thereof, a recess where the edge termination region 168 is lower than the active region 150 and at a bottom of the recess, the n-type silicon carbide epitaxial layer 2 is exposed. Further, in the edge termination region 168, a JTE structure in which multiple p⁺-type regions (herein, two (2) including a first JTE region 163 and a second JTE region 165) are disposed adjacently to one another is provided. Further, outside the JTE structure (toward the chip ends), an n⁺-type stopper region 167 functioning as channel stopper is provided.

The first JTE region 163 and the second JTE region 165 are respectively provided in portions of the n-type silicon carbide epitaxial layer 2 exposed at the bottom of the recess. When high voltage is applied, high voltage of a lateral direction other than that in the active region 150 is secured by pn junctions between the first JTE region 163, the second JTE region 165, and the n-type silicon carbide epitaxial layer 2.

Further, the structure of the main source ring region 170 is similar to that of the current sensing source ring region 232; the fourth p-type base layer (fourth second-semiconductor layer) 6d is provided in the silicon carbide semiconductor base; and on the fourth p-type base layer 6d, a fourth p++-type contact region 8d may be provided. On the fourth p++-type contact region 8d (in an instance in which the fourth p++-type contact region 8d is not provided, the fourth p-type base layer 6d, hereinafter, simply "(6d)"), the interlayer insulating film 11 is provided. In the interlayer insulating film 11, a contact hole that penetrates the interlayer insulating film 11 in the depth direction z and reaches the fourth p++-type contact region 8d(6d) is opened. In the contact hole, the fourth source electrode (fourth first-electrode) 13d is embedded. Therefore, similarly to the first source electrodes 13a, the fourth source electrode 13d is provided on the fourth p++-type contact region 8d(6d). Similarly to the first source electrodes 13a, on top of the fourth source electrode 13d, a fourth source electrode pad 15d that is a multilayer film in which the first TiN film 25, the first Ti film 26, the second TiN film 27, the second Ti film 28, and the Al alloy film 29 are stacked is provided. While not depicted, in the semiconductor base, p-type regions (the first p++-type contact regions 8a(6a), etc.) provided in a lower portion of the main semiconductor element 42 and p-type regions (the fourth p++-type contact region 8d(6d), etc.) provided in a lower portion of the main source ring region 170 are connected to one another, whereby the fourth source electrode 13d is at a potential equal to that of the first source electrodes 13a.

On the surface of the fourth source electrode pad 15d, the plating films 16 are provided and portions of the surface not occupied by the plating films 16 are covered by the first protective films 21. In particular, the first protective films 21 are provided so as to cover the fourth source electrode pad 15d and in openings of the first protective films 21, the plating films 16 are provided. Portions of the plating films 16 and of the first protective films 21 may be covered by the second protective films 23. The plating films 16 may cover an entire area of the surface of the fourth source electrode 13d.

As described above, the main source ring region 170 has a function of leading out, via the fourth p-type base layer 6d, hole current that flows into the active region 150 from the edge termination region 168 when the main semiconductor element 42 is OFF. Therefore, the main source ring region 170 enables concentration of current at ends of the active region 150 to be mitigated. Further, the fourth source electrode pad 15d and the plating films 16 are provided on the fourth source electrode 13d, whereby the resistance of the fourth source electrode 13d is reduced and the breakdown tolerance of the fourth source electrode 13d may be improved.

Further, in the Zener diode region 161, on the first p++-type contact regions 8a(6a) of the silicon carbide semiconductor base, Zener diodes 180 are provided via the insulating film 530. The Zener diodes 180 are insulated from the first p++-type contact regions 8a(6a) by the insulating film 530. The Zener diodes 180 are covered by the interlayer insulating film 11. In the interlayer insulating film 11, contact holes that penetrate the interlayer insulating film 11 in the depth direction z and reach the Zener diodes 180 are opened. In the contact holes, Zener diode wiring electrodes 181 are embedded. Further, on the interlayer insulating film 11 and the Zener diode wiring electrodes 181, the first protective films 21 are provided. The Zener diode wiring electrodes 181 are provided in short-circuit regions 501, 502, 503, 504, 601, 602, 603, 604 depicted in FIG. 5 described below.

Figure 5:
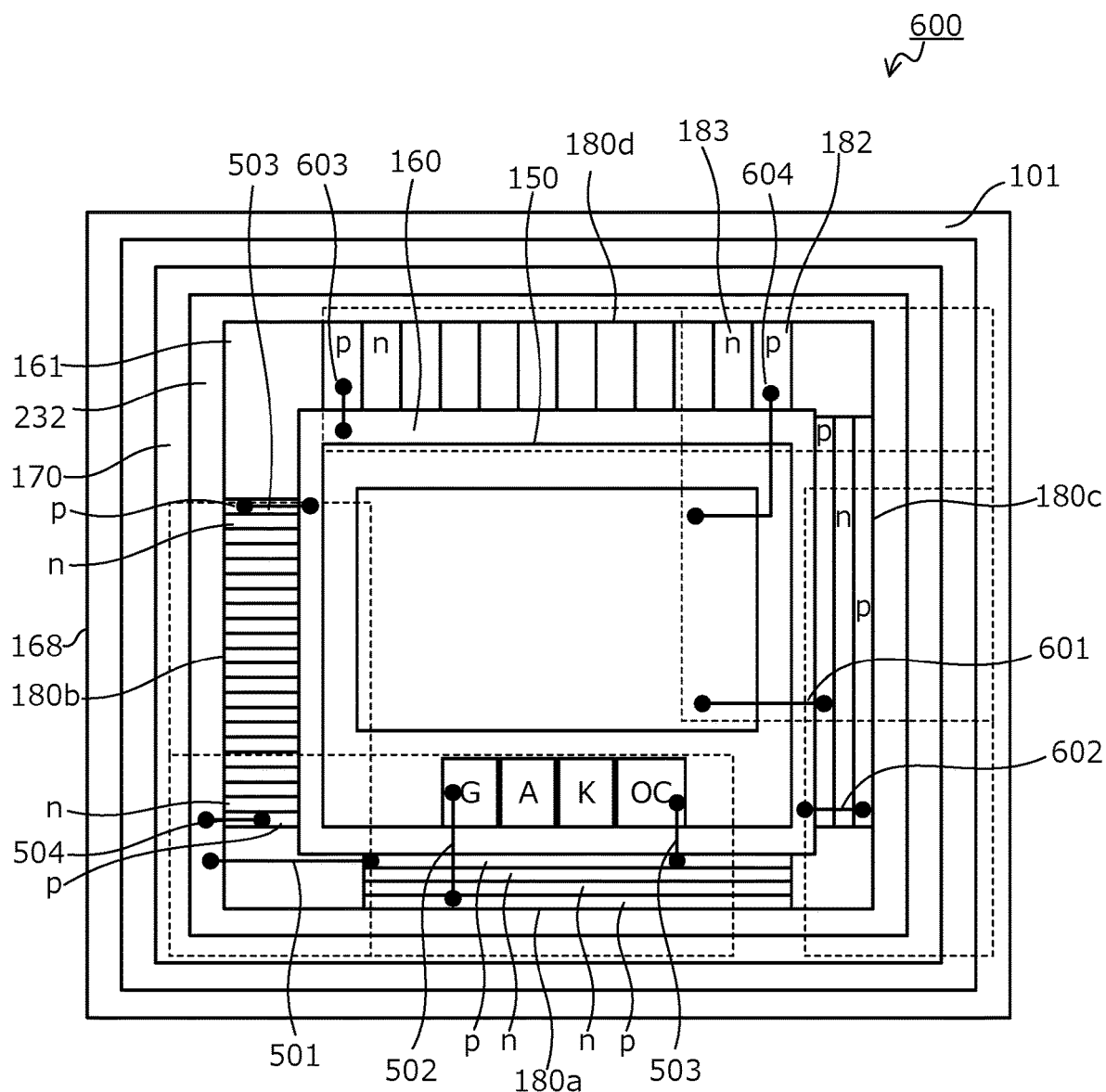
FIG. 5 is a detailed top view of a structure of a Zener diode region of the silicon carbide semiconductor device according to the first embodiment.

FIG. 5 is a detailed top view of the structure of the Zener diode region of the silicon carbide semiconductor device according to the first embodiment. As depicted in FIG. 5, in the Zener diode region 161, the Zener diodes 180 that include multiple n-type regions and p-type regions configured using polysilicon are provided in plural (in FIG. 5, first, second, third, and fourth Zener diodes 180a, 180b, 180c, 180d) and the p-type region at the end is connected to various electrodes.

The first Zener diode 180a is provided between the second source electrodes 13b of the current sensing region 37a and the current sensing source ring region 232. Further, the second Zener diode 180b is provided between the second source electrodes 13b of the current sensing region 37a and the current sensing source ring region 232, via the gate ring region 160. In particular, the short-circuit region 501 connects the third source electrode 13c of the current sensing source ring region 232 and the first Zener diode 180a; the short-circuit region 502 connects the second source electrodes 13b of the current sensing region 37a and the first Zener diode 180a; the short-circuit regions 503 connect second gate electrodes 10b of the current sensing region 37a and the second Zener diode 180b; and the short-circuit region 504 connects the third source electrode 13c of the current sensing source ring region 232 and the second Zener diode 180b. As a result, overcurrent between the second source electrodes 13b and the current sensing source ring region 232 may be absorbed.

Further, the third Zener diode 180c is provided between the first source electrodes 13a of the main semiconductor element 42 and the main source ring region 170, via the gate ring region 160. Further, the fourth Zener diode 180d is provided between the first gate electrodes 10a of the main semiconductor element 42 and the first source electrodes 13a of the main semiconductor element 42, via the gate ring region 160. In particular, the short-circuit region 601 connects the first source electrodes 13a of the main semiconductor element 42 and the third Zener diode 180c; the short-circuit region 602 connects the gate wiring electrode 30 provided in the gate ring region 160 and the third Zener diode 180c; the short-circuit region 603 connects the first gate electrodes 10a of the main semiconductor element 42 and the fourth Zener diode 180d; and the short-circuit region 604 connects the fourth source electrode 13d of the main source ring region 170 and the third Zener diode 180c. As a result, overcurrent between the first source electrodes 13a and the main source ring region 170 may be absorbed.

Further, the Zener diodes 180 include p-type regions (second semiconductor regions of the second conductivity type) 182 and n-type regions (third semiconductor regions of the first conductivity type) 183. For one of the p-type regions and n-type regions, the breakdown voltage is about 10V, however, the number of the p-type regions 182 and the n-type regions 183 is at least three, whereby the breakdown voltage is enhanced and at 10 mA, a breakdown voltage of at least 30V may be set. Further, in the first Zener diode 180a and the third Zener diode 180c, in a direction from the active region 150 toward the edge termination region 168, the p-type regions 182 and the n-type regions 183 are provided alternating one another; in the second Zener diode 180b and the fourth Zener diode 180d, in a direction orthogonal to the direction from the active region 150 toward the edge termination region 168, the p-type regions 182 and the n-type regions 183 are provided alternating one another.

Further, in the Zener diode region 161, four corner portions thereof are free of the Zener diodes 180 and insulating films are provided therein. As a result, electric field does not concentrate at the four corner portions.

The structure of the current sensing region 37a is similar to that of the main semiconductor element 42. The current sensing region 37a includes the second p-type base layers (second second-semiconductor layers of the second conductivity type) 6b, second n$^+$-type source regions 7b (second first-semiconductor regions of the first conductivity type) 7b, the second p$^{++}$-type contact regions 8b, second trenches (second trenches) 18b, second gate insulating films (second gate insulating films) 9b, the second gate electrodes (second gate electrodes) 10b, and the interlayer insulating film 11. Components of the MOS gates of the current sensing region are provided in the high-function region 400.

In the current sensing region 37a as well, similarly to the main semiconductor element 42, the second p$^{++}$-type contact regions 8b may be omitted. The current sensing region 37a, similarly to the effective region 150a, may have the n-type high-concentration regions 5. Further, the current sensing region 37a, similarly to the main semiconductor element 42, may have the first p$^+$-type base regions 3 and the second p$^+$-type base regions 4. The current sensing region 37a has the second source electrodes (second first-electrodes) 13b having a structure similar to that in the main semiconductor element 42 and on the second source electrodes 13b, the second source electrode pad 15b having a configuration similar to that of the first source electrode pad 15a of the main semiconductor element 42 is provided. On the second source electrode pad 15b, a structure similar to that on top of the first source electrode pad 15a of the main semiconductor element 42 is provided.

The temperature sensing region 35a has a function of detecting the temperature of the silicon carbide semiconductor device 600, using diode temperature characteristics. Therefore, the temperature sensing region 35a is provided in the active region 150 through which main current flows when the silicon carbide semiconductor device 600 is ON.

As depicted in FIG. 4, in the temperature sensing region 35a, the n-type silicon carbide epitaxial layer 2 is deposited on the first main surface (front surface), for example, a (0001)-plane (Si-face) of the n$^+$-type silicon carbide substrate 1 and on the n-type silicon carbide epitaxial layer 2, at the first surface thereof closest to the first main surface of the silicon carbide semiconductor base, a p-type base layer 6 is provided. In the p-type base layer 6, at a first surface thereof that is the first main surface of the silicon carbide semiconductor base, p$^{++}$-type contact regions 8 may be provided and at a second surface facing the second main surface of the silicon carbide semiconductor base, the first p$^+$-type base regions 3 may be provided.

Further, on the p$^{++}$-type contact regions 8 (in an instance in which the p$^{++}$-type contact regions 8 are not provided, the p-type base layer 6, hereinafter, simply "(6)"), a field insulating film 80 is provided and on the field insulating film 80, the p-type polysilicon layer 81 and the n-type polysilicon layer 82 are provided. The p-type polysilicon layer 81 and the n-type polysilicon layer 82 are a polysilicon diode formed by pn junctions. Instead of the p-type polysilicon layer 81 and the n-type polysilicon layer 82, a diffusion diode formed by pn junctions between p-type diffusion regions and n-type diffusion regions may be used as the temperature sensing region 35a. In this instance, for example, p-type diffusion regions and n-type diffusion regions configuring the diffusion diode suffice to each be formed in n-type separation regions (not depicted) selectively formed in the second p$^+$-type base regions 4.

On the p-type polysilicon layer 81, the anode electrode 84 is provided; the anode electrode pad 201A is electrically connected to the p-type polysilicon layer 81 via the anode electrode 84. On the n-type polysilicon layer 82, the cathode electrode 85 is provided; the cathode electrode pad 201B is electrically connected to the n-type polysilicon layer 82 via the cathode electrode 85. Similarly to the first source electrode pad 15a of the main semiconductor element 42, the external terminal electrodes 19 are bonded to the anode electrode pad 201A and the cathode electrode pad 201B, via the plating films 16 and the solder 17; the anode electrode pad 201A and the cathode electrode pad 201B are protected by the first protective films 21 and the second protective films 23.

Further, a polysilicon diode may be provided in the n-type silicon carbide epitaxial layer 2 or the first p$^+$-type base regions 3. For example, temperature sensing trenches (not depicted) that penetrate the p-type base layer 6 from the first surface thereof opposite the second surface thereof facing the n$^+$-type silicon carbide substrate 1, and reach the first p$^+$-type base regions 3 (in an instance in which the first p$^+$-type base regions 3 are not provided, the n-type silicon carbide epitaxial layer 2) are provided and the polysilicon diode may be provided in temperature sensing trenches via insulating films. The insulating films may have a film thickness greater than that of the first gate insulating films 9a in the first trenches 18a of the main semiconductor element 42 or a thickness about equal thereto. The temperature sensing trenches may have a shape similar to the shape of the first trenches 18a of the main semiconductor element 42 or may have a different shape. For example, the temperature sensing trenches may have a trench width and/or a depth greater than the trench width and/or the depth of the first trenches 18a of the main semiconductor element 42.

In this instance, diodes of the temperature sensing region 35a are provided in the insulating films embedded in the temperature sensing trenches, close to a heat generating source as compared to conventionally and therefore, an internal temperature of an element may be measured accurately, improving the accuracy of the temperature measurement.

Next, a method of manufacturing the silicon carbide semiconductor device according to the first embodiment will be described. FIGS. 6, 7, 8, 9, 10, and 11 are cross-sectional views of states of the silicon carbide semiconductor device according to the present embodiment during manufacture.

Figure 6:
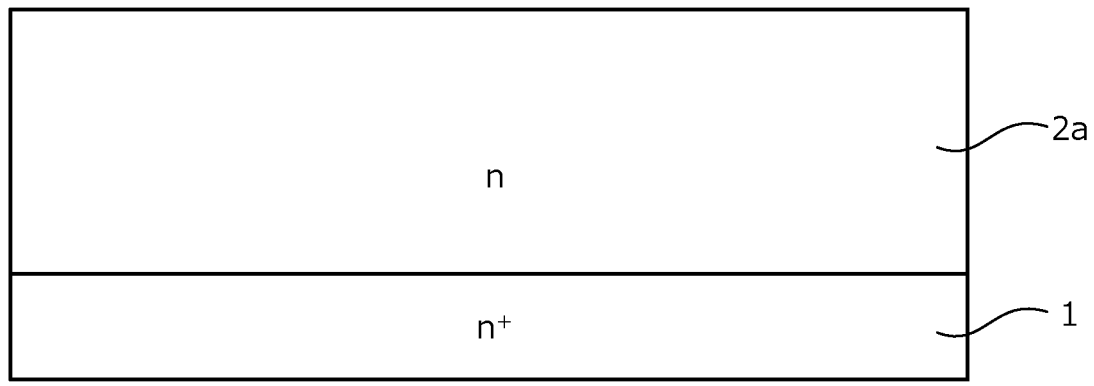
FIG. 6 is a cross-sectional view of a state of the silicon carbide semiconductor device according to the present embodiment during manufacture.

First, the n$^+$-type silicon carbide substrate 1 containing an n-type silicon carbide is prepared. Subsequently, on the first main surface of the n$^+$-type silicon carbide substrate 1, a first n-type silicon carbide epitaxial layer 2a containing silicon carbide is epitaxially grown to have a thickness of, for example, about 30 μm while an n-type impurity, for example, nitrogen atoms (N) is doped. The state up to here is depicted in FIG. 6.

Next, on the surface of the first n-type silicon carbide epitaxial layer 2a, an ion implantation mask having predetermined openings is formed by a photolithographic technique using, for example, an oxide film. Subsequently, a p-type impurity such as aluminum is implanted in the openings of the oxide film, forming lower first p$^+$-type base regions 3a and the second p$^+$-type base regions 4 of a depth of about 0.5 μm.

Further, formation is such that a distance between each of the lower first p$^+$-type base regions 3a and a corresponding one of the second p$^+$-type base regions 4 adjacent thereto is about 1.5 μm. An impurity concentration of the lower first p$^+$-type base regions 3a and the second p$^+$-type base regions 4 is set to, for example, about 5×10$^{18}$/cm$^3$.

Figure 7:
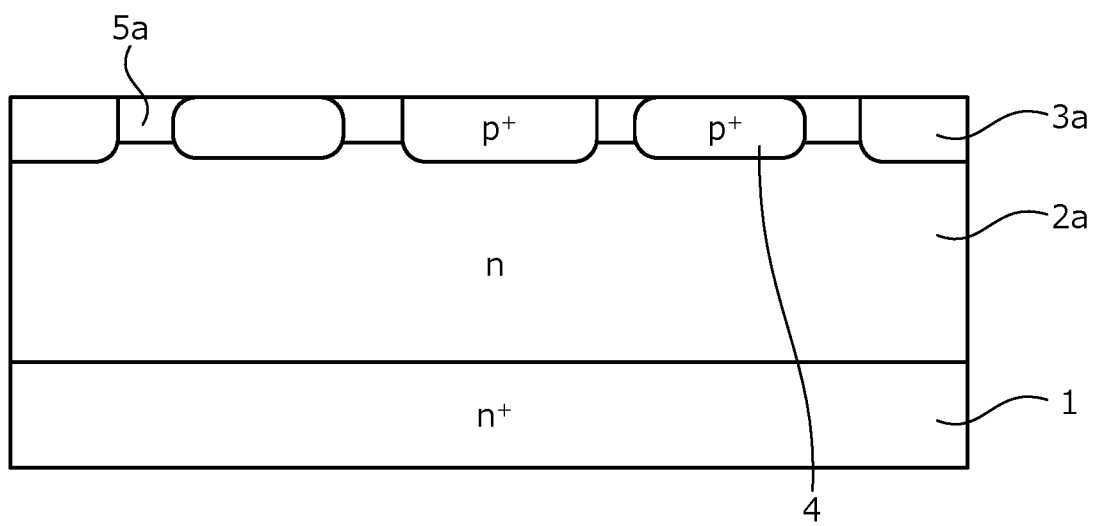
FIG. 7 is a cross-sectional view of a state of the silicon carbide semiconductor device according to the present embodiment during manufacture.

Next, portions of the ion implantation mask may be removed and an n-type impurity such as nitrogen may be ion-implanted in the openings, whereby in portions of surface regions of the first n-type silicon carbide epitaxial layer 2a, lower n-type high-concentration regions 5a of a depth of, for example, about 0.5 μm may be formed. An impurity concentration of the lower n-type high-concentration regions 5a is set to, for example, about 1×10$^{17}$/cm$^3$. The state up to here is depicted in FIG. 7.

Next, on the surface of the first n-type silicon carbide epitaxial layer 2a, a second n-type silicon carbide epitaxial layer 2b doped with an n-type impurity such as nitrogen is formed having a thickness of about 0.5 μm. An impurity concentration of the second n-type silicon carbide epitaxial layer 2b is set to be about 3×10$^{15}$/cm$^3$. Hereinafter, the first n-type silicon carbide epitaxial layer 2a and the second n-type silicon carbide epitaxial layer 2b collectively are the n-type silicon carbide epitaxial layer 2.

Next, on the surface of the second n-type silicon carbide epitaxial layer 2b, an ion implantation mask having predetermined openings is formed by photolithography using, for example, an oxide film. Subsequently, a p-type impurity such as aluminum is implanted in the openings of the oxide film, whereby upper first p$^+$-type base regions 3b of a depth of about 0.5 μm are formed overlapping the lower first p$^+$-type base regions 3a. The lower first p$^+$-type base regions 3a and the upper first p$^+$-type base regions 3b form connected regions, thereby forming the first p$^+$-type base regions 3. An impurity concentration of the upper first p$^+$-type base regions 3b is set to be, for example, about 5×10$^{18}$/cm$^3$.

Figure 8:
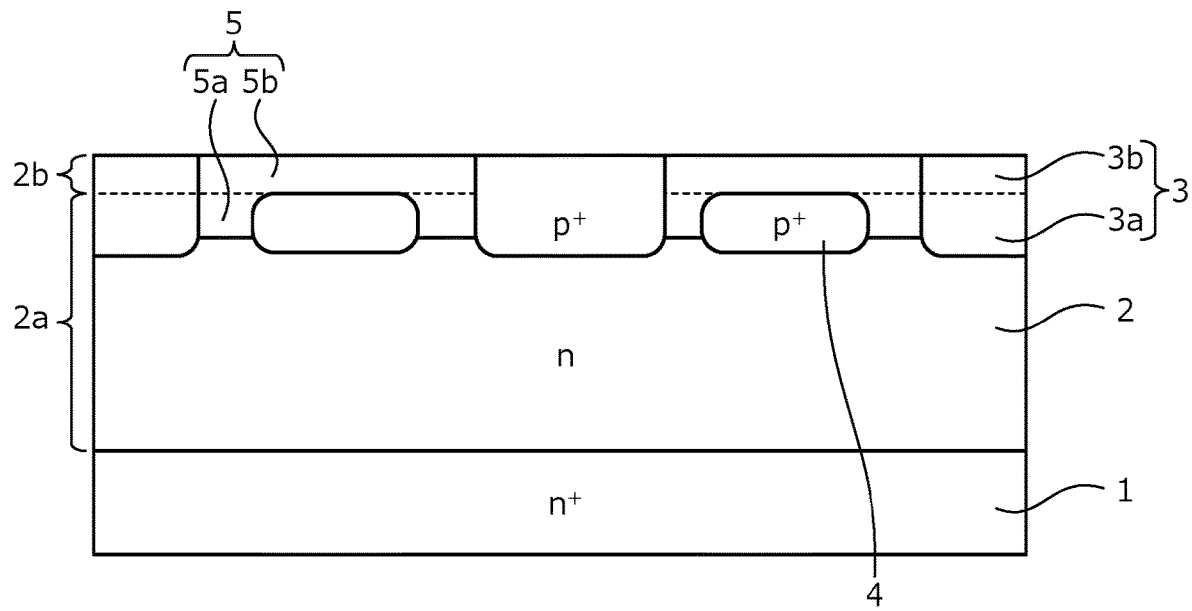
FIG. 8 is a cross-sectional view of a state of the silicon carbide semiconductor device according to the present embodiment during manufacture.

Next, portions of the ion implantation mask may be removed, an n-type impurity such as nitrogen may be ion-implanted in the openings, whereby in portions of surface regions of the second n-type silicon carbide epitaxial layer 2b, upper n-type high-concentration regions 5b of a depth of, for example, about 0.5 μm may be formed. An impurity concentration of the upper n-type high-concentration regions 5b is set to be, for example, about 1×10$^{17}$/cm$^3$. The upper n-type high-concentration regions 5b and the lower n-type high-concentration regions 5a are formed to at least partially contact one another to thereby form the n-type high-concentration regions 5. However, the n-type high-concentration regions 5 may be formed in an entire area of the substrate surface or may be omitted. The state up to here is depicted in FIG. 8.

Next, on the surface of the n-type silicon carbide epitaxial layer 2, the first p-type base layer 6a is formed by epitaxial growth to have a thickness of about 1.1 μm. An impurity concentration of the first p-type base layer 6a is set to be about 4×10$^{17}$/cm$^3$. After the first p-type base layer 6a is formed by epitaxial growth, a p-type impurity such as aluminum may be further ion-implanted in the first p-type base layer 6a.

Figure 9:
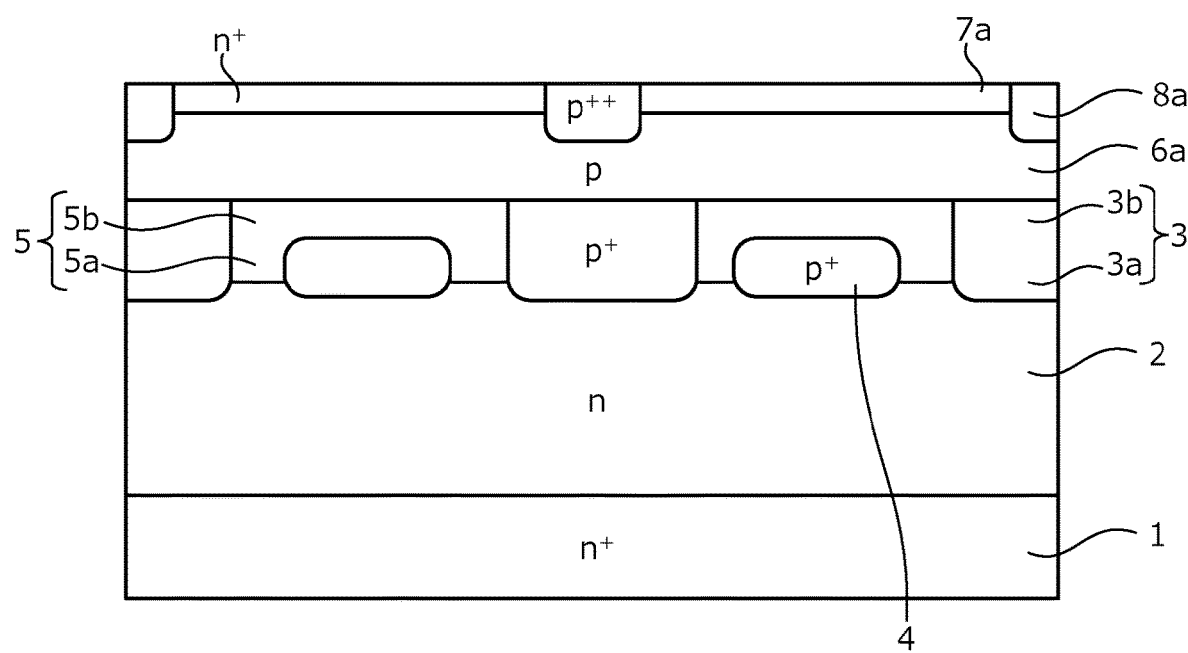
FIG. 9 is a cross-sectional view of a state of the silicon carbide semiconductor device according to the present embodiment during manufacture.

Next, on the surface of the first p-type base layer 6a, an ion implantation mask having predetermined openings is formed by photolithography using, for example, an oxide film. In the openings, an n-type impurity such as nitrogen (N) or phosphorus (P) is ion-implanted, thereby forming the first n$^+$-type source regions 7a at portions of the surfaces of the first p-type base layer 6a. Next, the ion implantation mask used in the formation of the first n$^+$-type source regions 7a is removed and by a similar method, an ion implantation mask having predetermined openings may be formed, a p-type impurity such as phosphorus may be ion-implanted in portions of the surface of the first p-type base layer 6a, whereby the first p$^{++}$-type contact regions 8a may be formed. An impurity concentration of the first p$^{++}$-type contact regions 8a is set to be higher than the impurity concentration of the first p-type base layer 6a. The state up to here is depicted in FIG. 9. Similarly, in the current sensing region 37a, the main source ring region 170, and the current sensing source ring region 232, the second to the fourth the p-type base layers 6b to 6d, the second n$^+$-type source regions 7b, and the second to the fourth second p$^{++}$-type contact regions 8b to 8d are formed.

Next, a heat treatment (annealing) under an inert gas atmosphere of a temperature of about 1700 degrees C. is performed, thereby implementing an activation treatment of the first p$^+$-type base regions 3, the second p$^+$-type base regions 4, the first and the second n$^+$-type source regions 7a, 7b, and the first to the fourth p$^{++}$-type contact regions 8a to 8d. As described above, the ion implanted region may be collectively activated by a single session of the heat treatment or may be activated by performing the heat treatment each time ion implantation is performed.

Figure 10:
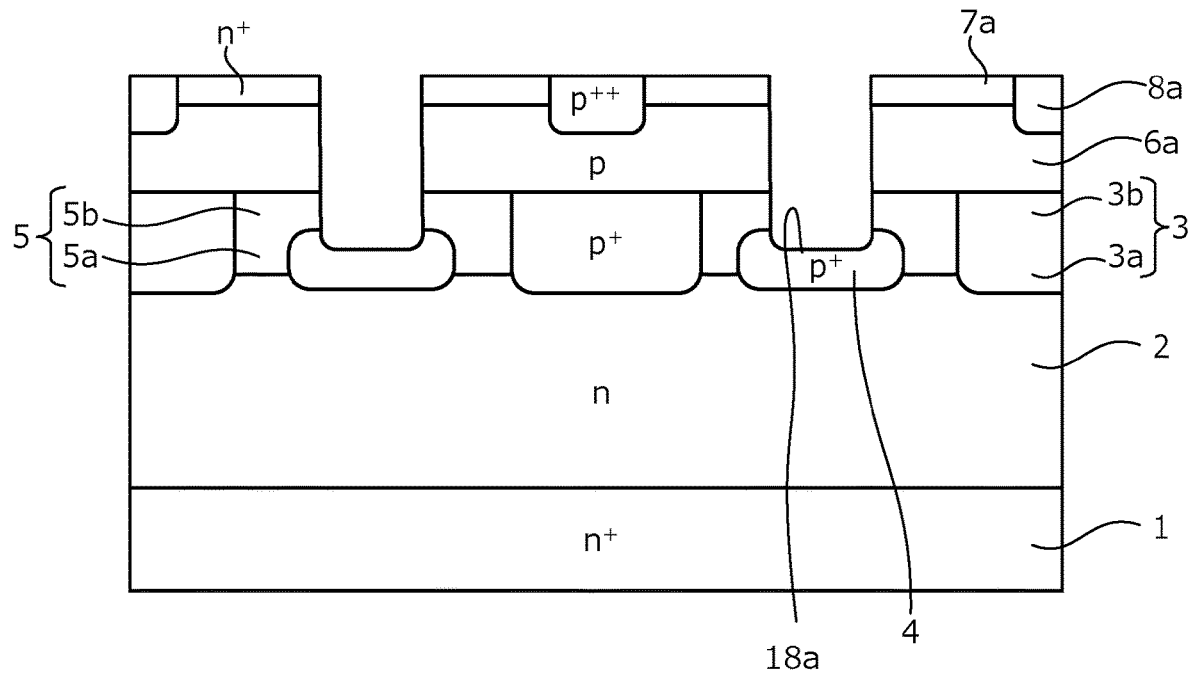
FIG. 10 is a cross-sectional view of a state of the silicon carbide semiconductor device according to the present embodiment during manufacture.

Next, on the surface of the first p-type base layer 6a, a trench formation mask having predetermined openings is formed by photolithography, using, for example, an oxide film. Next, the first trenches 18a that penetrate the first p-type base layers 6a and reach the n-type high-concentration regions 5(2) are formed by dry etching. Bottoms of the first trenches 18a may reach the second p$^+$-type base regions 4 formed in the n-type high-concentration regions 5(2). Next, the trench formation mask is removed. The state up to here is depicted in FIG. 10.

Next, along surfaces of the first n$^+$-type source regions 7a and the bottoms and sidewalls of the first trenches 18a, the first gate insulating films 9a are formed. The first gate insulating films 9a may be formed by thermal oxidation of a temperature of 1000 degrees C. under an oxygen atmosphere. Further, the first gate insulating films 9a may be formed by a deposition method by a chemical reaction such as that for a high temperature oxide (HTO).

Next, on the first gate insulating films 9a, for example, a polycrystalline silicon layer doped with phosphorus atoms is formed. The polycrystalline silicon layer may be formed so as to be embedded in the first trenches 18a. The polycrystalline silicon layer is patterned by photolithography and is left in the first trenches 18a, thereby forming the first gate electrodes 10a.

Figure 11:
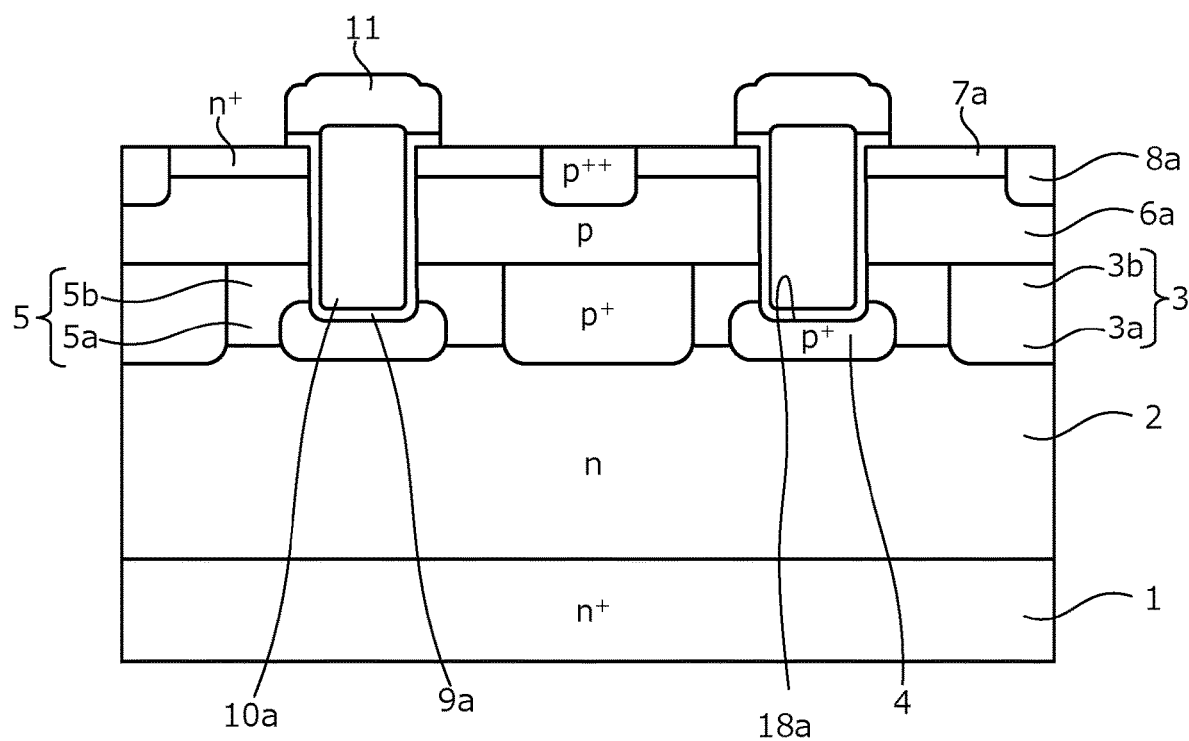
FIG. 11 is a cross-sectional view of a state of the silicon carbide semiconductor device according to the present embodiment during manufacture.

Next, for example, a phosphate glass is deposited so as to cover the first gate insulating films 9a and the first gate electrodes 10a and have a thickness of about 1 μm, whereby the interlayer insulating film 11 is formed. Next, a barrier metal formed by titanium (Ti), or titanium nitride (TiN), or stacked layers of titanium and titanium nitride may be formed so as to cover the interlayer insulating film 11. The interlayer insulating film 11 and the first gate insulating films 9a are patterned by photolithography, thereby forming contact holes in which the first n$^+$-type source regions 7a and the first p$^{++}$-type contact regions 8a are exposed. Thereafter, a heat treatment (reflow) is performed, thereby planarizing the interlayer insulating film 11. The state up to here is depicted in FIG. 11. Further, after the contact holes are formed in the interlayer insulating film 11, a barrier metal formed by titanium (Ti), or titanium nitride (TiN), or stacked layers of titanium and titanium nitride may be formed. In this instance, contact holes exposing the first n$^+$-type source regions 7a and the first p$^{++}$-type contact regions 8a are provided in the barrier metal as well.

Next, on the interlayer insulating film 11 and in the contact holes provided in the interlayer insulating film 11, a conductive film forming the first source electrodes 13a is formed. The conductive film is, for example, a nickel (Ni) film. Further, on the second main surface of the $n^+$-type silicon carbide substrate 1 as well, a nickel (Ni) film is similarly formed. Thereafter, a heat treatment of a temperature of, for example, about 970 degrees C. is performed and the nickel film in the contact holes is converted into a silicide, thereby forming the first source electrodes 13a. A nickel film formed concurrently on the second main surface becomes the back electrode 14 that forms an ohmic contact with the $n^+$-type silicon carbide substrate 1. Thereafter, unreacted portions of the nickel film are selectively removed, whereby, for example, the first source electrodes 13a are left only in the contact holes. Similarly, in the current sensing region 37a, the second source electrodes 13b are formed. Similarly, in the current sensing source ring region 232, the third source electrode 13c is formed; and similarly, in the main source ring region 170, the fourth source electrode 13d is formed.

Next, for example, by a sputtering method, the first TiN film 25, the first Ti film 26, the second TiN film 27, and the second Ti film 28 are sequentially deposited so as to cover the interlayer insulating film 11 and the first source electrodes 13a on the front surface of the silicon carbide semiconductor base; the Al alloy film 29 is further formed so that a thickness becomes, for example, about 5 μm. The Al alloy film 29 is, for example, an Al—Si film or an Al—Si—Cu film. The Al alloy film 29 may be an Al film. This conductive film is patterned by photolithography to be left in an entire area of the active region 150 of the element, whereby the first source electrode pad 15a is formed. Similarly, in the current sensing region 37a, the main source ring region 170, and the current sensing source ring region 232, the first TiN film 25, the first Ti film 26, the second TiN film 27, and the second Ti film 28 are sequentially stacked and the Al alloy film 29 is further formed, thereby forming the second to the fourth source electrode pads 15b to 15d.

Next, after a polyimide film is formed on the Al alloy film 29, the polyimide film is selectively removed by photolithography and etching, thereby forming the first protective films 21 and openings in the first protective films 21. Next, on the Al alloy film 29 exposed in the openings of the first protective films 21, the plating films 16 are formed. Similarly, in the current sensing region 37a, the current sensing source ring region 232, and the main source ring region 170, the plating films 16 and the first protective films 21 are formed.

Next, the second protective films 23 are formed so as to cover borders between the plating films 16 and the first protective films 21. The second protective films 23 are, for example, a polyimide film. Thereafter, the external terminal electrodes 19 are formed on the plating films 16 via the solder 17.

Further, in the gate ring region 160 and the Zener diode region 161, the insulating film 530 is formed on the surfaces of the $p^{++}$-type contact regions 8.

Next, in the gate ring region 160, on the insulating film 530, the third gate electrode 10c is formed; and in the Zener diode region 161, the Zener diodes 180 are formed on the insulating film 530. Thereafter, for example, a phosphate glass is deposited so as to cover the third gate electrode 10c and the Zener diodes 180 and have a thickness of about 1 μm, whereby the interlayer insulating film 11 is formed. The interlayer insulating film 11 is patterned by photolithography to form contact holes that expose the third gate electrode 10c and the Zener diodes 180. Thereafter, by methods similar to those for the main source ring region 170, the gate wiring electrode 30 is formed on the third gate electrode 10c, the Zener diode wiring electrodes 181 are formed on the Zener diodes 180, and the first protective films 21 are formed on the gate wiring electrode 30, the Zener diode wiring electrodes 181, and the interlayer insulating film 11. The short-circuit regions 501, 502, 503, 504, 601, 602, 603, 604 depicted in FIG. 5 are formed by the Zener diode wiring electrodes 181.

Elements other than the main semiconductor element 42 (for example, the current sensing region 37a, for example, the diffusion diode forming the overcurrent current protecting region, a complementary MOS (CMOS) configuring the arithmetic circuit region) suffice to be formed in the high-function region 400 of the silicon carbide semiconductor device 600 concurrently with corresponding components of the main semiconductor element 42 described above. Further, formation may be by processes other than those for the main semiconductor element 42.

For example, the temperature sensing region 35a is formed as follows. Before electrode pad formation when the main semiconductor element 42 is formed, the p-type polysilicon layer 81, the n-type polysilicon layer 82, the anode electrode 84, and the cathode electrode 85 are formed on the field insulating film 80 by a general method.

Further, the p-type polysilicon layer 81 and the n-type polysilicon layer 82 of the temperature sensing region 35a may be formed concurrently with, for example, the first and the second gate electrodes 10a, 10b of the main semiconductor element 42 and the current sensing region 37a. The field insulating film 80 may be a portion of the insulating film 530 of the gate ring region 160 and the Zener diode region 161. In this instance, the p-type polysilicon layer 81 and the n-type polysilicon layer 82 of the temperature sensing region 35a are formed after the formation of the insulating film 530 of the gate ring region 160 and the Zener diode region 161. Thereafter, for example, a phosphate glass is deposited so as to have a thickness of about 1 μm and cover the p-type polysilicon layer 81 and the n-type polysilicon layer 82, whereby the interlayer insulating film 11 is formed. The interlayer insulating film 11 is patterned by photolithography to form contact holes that expose the p-type polysilicon layer 81 and the n-type polysilicon layer 82.

Next, the anode electrode 84 and the cathode electrode 85 respectively in contact with the p-type polysilicon layer 81 and the n-type polysilicon layer 82, and the anode electrode pad 201A and the cathode electrode pad 201B respectively in contact with the anode electrode 84 and the cathode electrode 85 are formed. The anode electrode pad 201A and the cathode electrode pad 201B may be formed together with the first source electrode pad 15a and may have a stacked structure similar to that of the first source electrode pad 15a.

Next, a polyimide film is formed so as to cover the anode electrode pad 201A and the cathode electrode pad 201B. Next, the polyimide film is selectively removed by photolithography and etching, whereby the first protective films 21 covering the anode electrode pad 201A and the cathode electrode pad 201B are formed and openings are formed in the first protective films 21.

Next, the plating films 16 are selectively formed on tops of the anode electrode pad 201A and the cathode electrode pad 201B, and the second protective films 23 covering the borders between the plating films 16 and the first protective films 21 are formed. Next, the external terminal electrodes 19 are formed on the plating films 16 via the solder 17. As described above, the temperature sensing region 35a is formed.

Further, in an instance in which polysilicon diodes are formed in the temperature sensing trenches (not depicted), the p-type polysilicon layer 81 and the n-type polysilicon layer 82 are formed as follows. During the formation of the first trenches 18a of the main semiconductor element 42, the temperature sensing trenches are concurrently formed. Next, during formation of the first gate insulating films 9a of the main semiconductor element 42, the insulating films of the temperature sensing region 35a are formed. Here, the insulating films may be formed to have a film thickness greater than that of the first gate insulating films 9a or may be formed to have a thickness about equal thereto. Next, a non-doped polysilicon is formed on top of the formed insulating films. In portions of the formed polysilicon, an anode region and a cathode region are formed, whereby the p-type polysilicon layer 81 and the n-type polysilicon layer 82 are formed. In this manner, the silicon carbide semiconductor device depicted in FIGS. 1 to 5 is completed.

Figure 12:
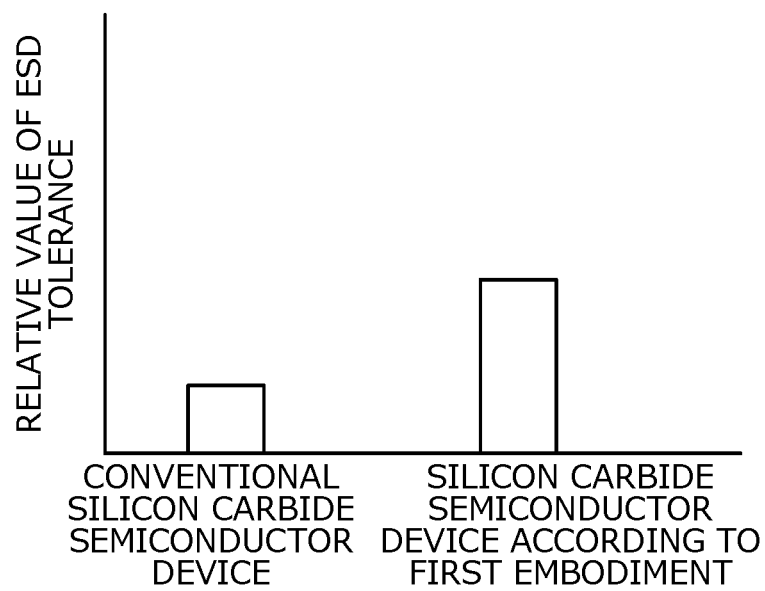
FIG. 12 is a graph of relative values of ESD tolerance for the silicon carbide semiconductor device according to the first embodiment and a conventional silicon carbide semiconductor device.

FIG. 12 is a graph of relative values of ESD tolerance for the silicon carbide semiconductor device according to the first embodiment and the conventional silicon carbide semiconductor device. As depicted in FIG. 12, in the silicon carbide semiconductor device according to the first embodiment, having the Zener diode region 161, the current sensing source ring region 232, and the main source ring region 170, ESD tolerance is improved as compared to the conventional silicon carbide semiconductor device.

As described above, according to the silicon carbide semiconductor device according to the first embodiment, the main source ring region is provided between the edge termination region and the gate ring region, and the current sensing source ring region is provided closer to the center portion of the chip than is the main source ring region. The current sensing source ring region is electrically connected to the source electrodes of the current sensing region, whereby the potential of the source electrodes of the current sensing region may be stabilized. Therefore, ESD tolerance of the current sensing region may be improved.

Further, the Zener diode region is provided closer to the center portion of the chip than is current sensing source ring region, whereby the arithmetic area of the Zener diode region may be increased, further improving the ESD tolerance of current sensing region and enabling improvement of the breakdown tolerance during switching.

Figure 13:
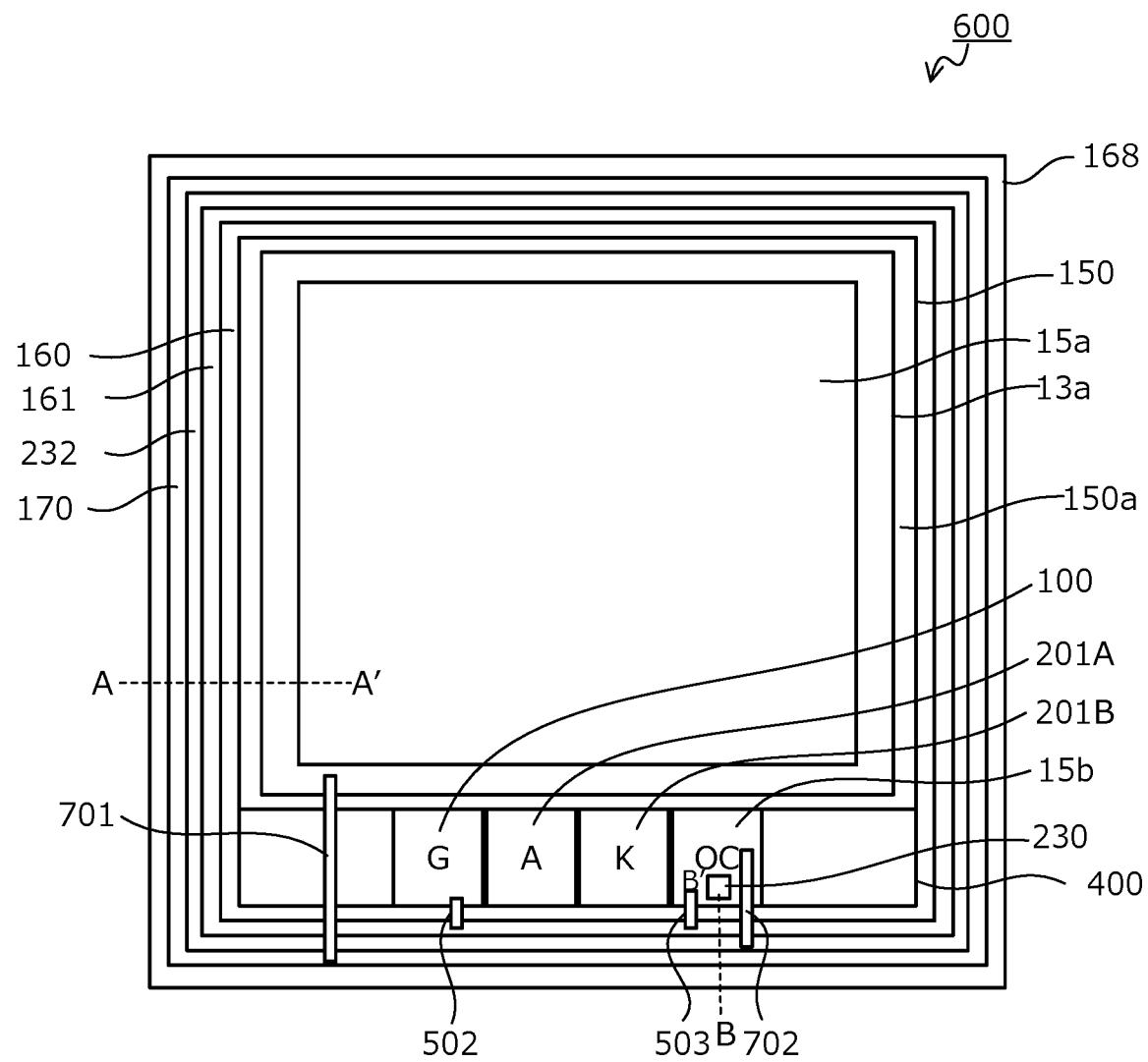
FIG. 13 is a top view of a structure of a silicon carbide semiconductor device according to a second embodiment.
Figure 14:
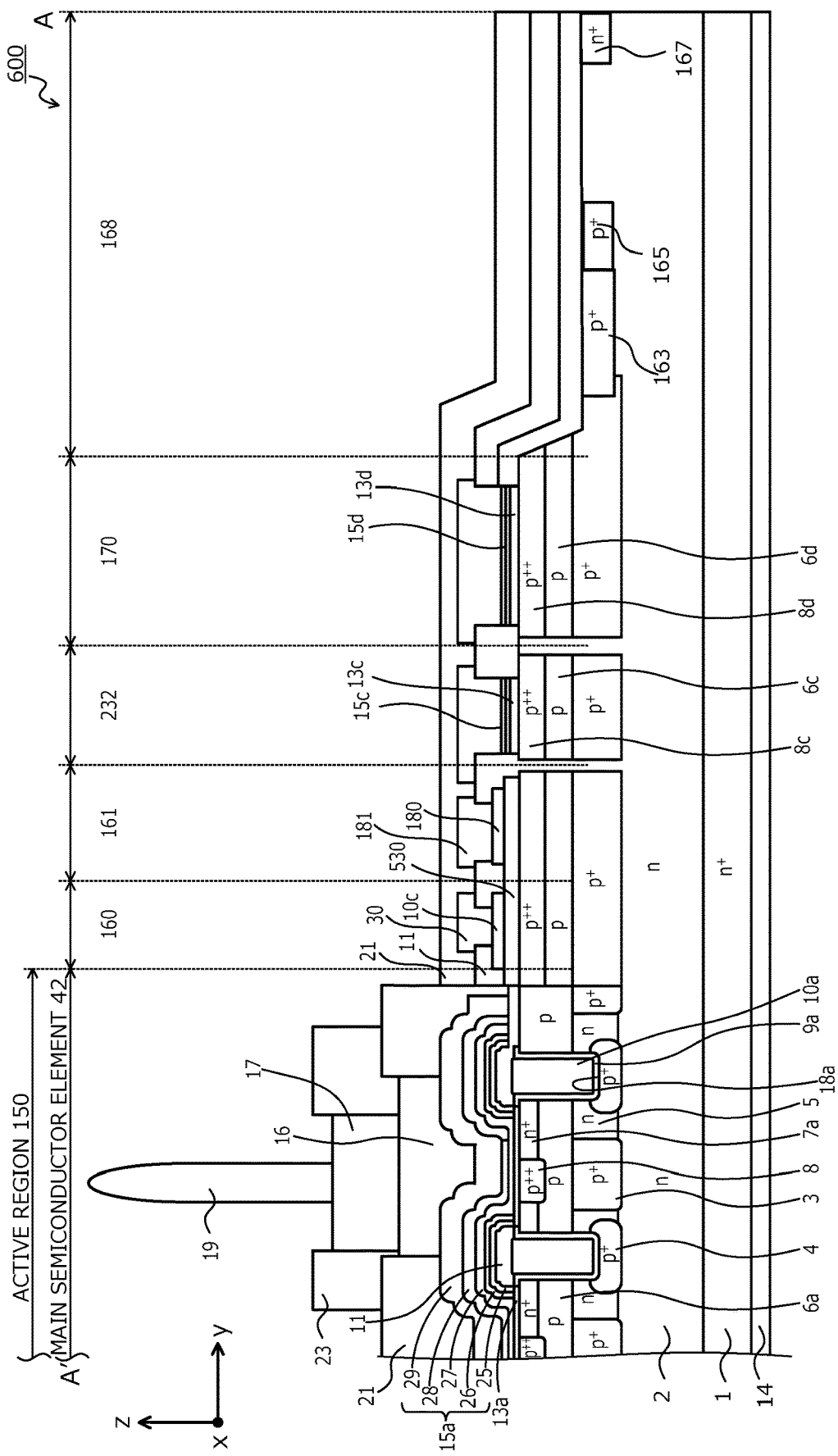
FIG. 14 is a cross-sectional view of the structure of the silicon carbide semiconductor device according to the second embodiment, along cutting line A-A' in FIG. 13.
Figure 15:
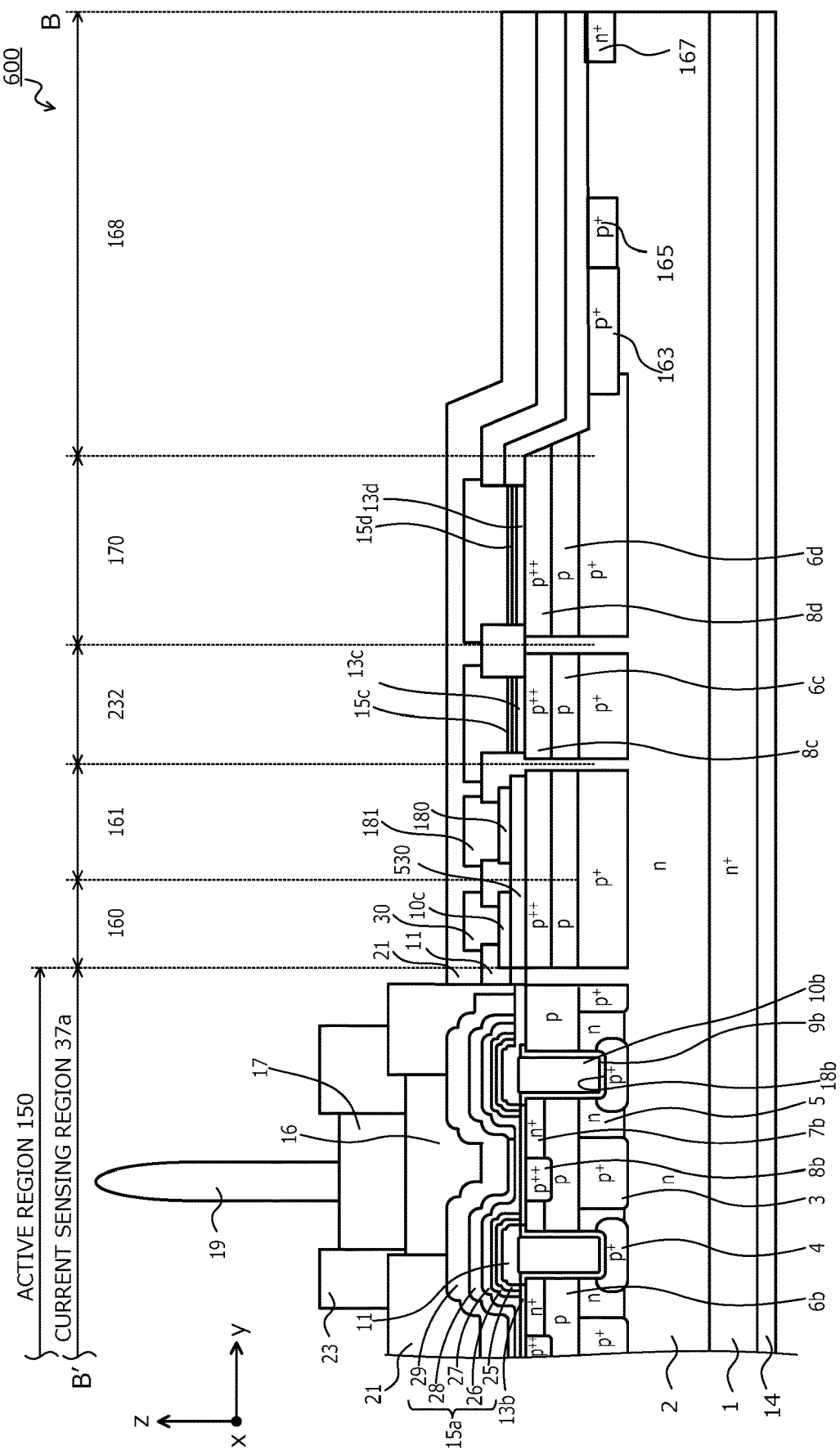
FIG. 15 is a cross-sectional view of the structure of the silicon carbide semiconductor device according to the second embodiment, along cutting line B-B' in FIG. 13.
Figure 16:
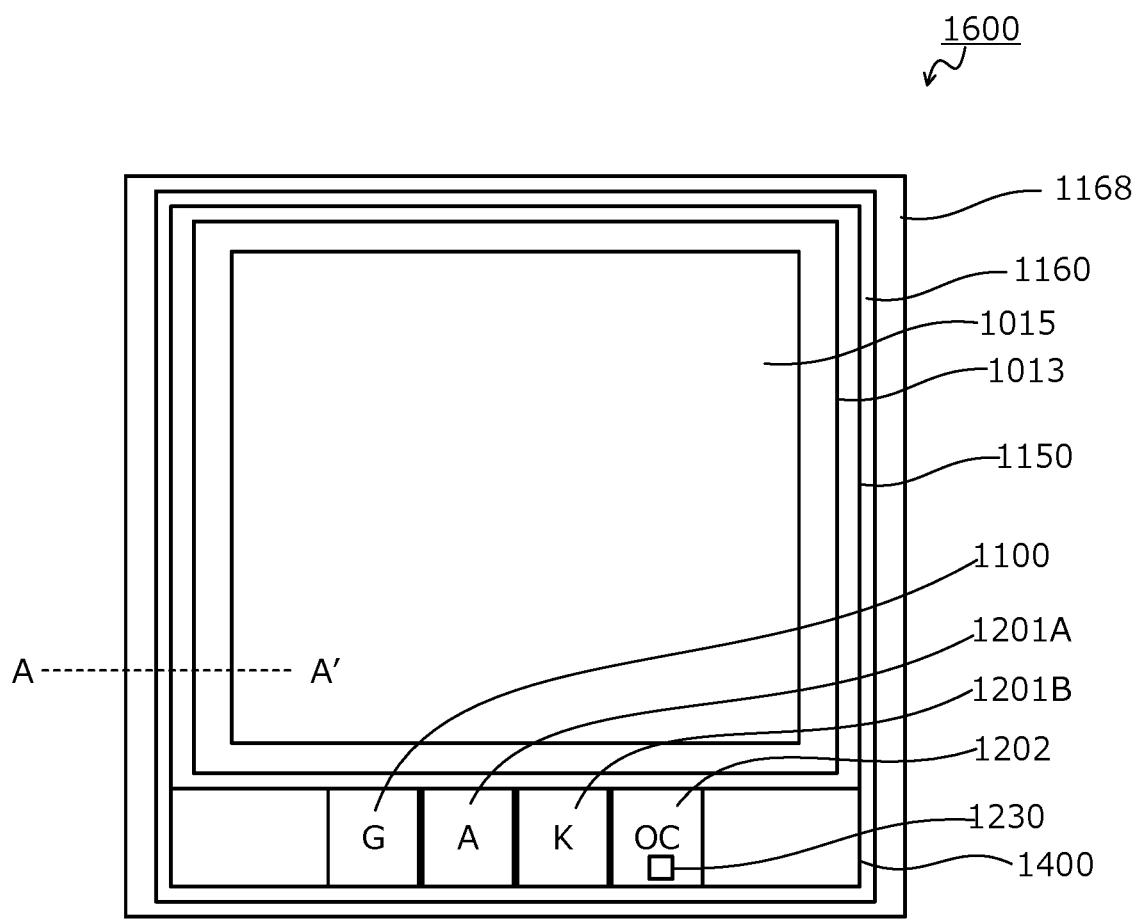
FIG. 16 is a top view of a structure of the conventional silicon carbide semiconductor device.

Next, a structure of a silicon carbide semiconductor device according to a second embodiment will be described. FIG. 13 is a top view of the structure of the silicon carbide semiconductor device according to the second embodiment. FIG. 14 is a cross-sectional view of the structure of the silicon carbide semiconductor device according to the second embodiment, along cutting line A-A' in FIG. 13. FIG. 15 is a cross-sectional view of the structure of the silicon carbide semiconductor device according to the second embodiment, along cutting line B-B' in FIG. 13.

The silicon carbide semiconductor device according to the second embodiment differs from the silicon carbide semiconductor device according to the first embodiment in that a short-circuit region (first short-circuit region) 701 connecting the first source electrodes 13a of the main semiconductor element 42 and the fourth source electrode 13d of the main source ring region 170, and a short-circuit region (second short-circuit region) 702 connecting the second source electrodes 13b of the current sensing region 37a and the third source electrode 13c of the current sensing source ring region 232 are provided.

For example, upper portions the gate ring region 160 and the Zener diode region 161 are covered by an insulating film (not depicted), openings are provided in the insulating film, and in the openings, the short-circuit regions 701, 702 are provided, whereby the silicon carbide semiconductor device according to the second embodiment is achieved.

As described above, according to the second embodiment, the short-circuit region connecting the first source electrodes and the fourth source electrode, and the short-circuit region connecting the second source electrodes and the third source electrode are provided, whereby hole current lead out by the source ring region may be caused to flow to the first source electrodes, enabling the concentration of current at ends of the active region to be further mitigated. Furthermore, effects similar to those of the first embodiment may be obtained.

In the foregoing, various modifications within a range not departing from the spirit of the invention are possible, for example, in the embodiments described above, dimensions, impurity concentrations, etc. of regions may be variously set according to necessary specifications. For example, the trench structure may be replaced with a planar structure, the MOSFET may be replaced with an IGBT. Further, in the embodiments described above, while an instance in which silicon carbide is used as a wide bandgap semiconductor is described as an example, application is possible to a wide bandgap semiconductor other than silicon carbide such as, for example, gallium nitride (GaN). Further, in the embodiments, while the first conductivity type is an n-type and the second conductivity type is a p-type, the present invention is similarly implemented when the first conductivity type is a p-type and the second conductivity type is an n-type.

According to the invention described above, the main source ring region (second ring region) is provided between the edge termination region and the gate ring region, and the current sensing source ring region (first ring region) is provided closer to the center portion of the chip than is the main source ring region. The source electrode (third first-electrode) of the current sensing source ring region is electrically connected to the source electrodes (second first-electrodes) of the current sensing region (second MOS structure region), whereby the potential of the source electrodes of the current sensing region may be stabilized. Therefore, the ESD tolerance of the current sensing region may be improved.

Further, the Zener diode region is provided closer to the center portion of the chip than is current sensing source ring region, whereby the arithmetic area of the Zener diode region may be increased, further improving the ESD tolerance of the current sensing region and enabling improvement of the breakdown tolerance during switching.

The semiconductor device according to the present invention achieves an effect in that the ESD tolerance of the active region of the current sensing region may be improved.

As described above, the semiconductor device according to the present invention is useful for power converting equipment such as inverters, power source devices such as those of various types of industrial machines, and igniters of automobiles.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device having, in a top view thereof,
an active region configured by a first MOS (metal oxide semiconductor) structure region and a second MOS structure region,
a gate ring region surrounding a periphery of the active region,
a first ring region surrounding a periphery of the gate ring region,
a second ring region surrounding a periphery of the first ring region, and
a termination region surrounding a periphery of the second ring region,
the semiconductor device comprising:
a semiconductor substrate of a first conductivity type, having a front surface and a back surface;
a first semiconductor layer of the first conductivity type, provided on the front surface of the semiconductor substrate and having an impurity concentration lower than that of the semiconductor substrate, the first semiconductor layer having a first surface and a second surface that are opposite to each other, the second surface thereof facing the semiconductor substrate;
in the active region and the gate ring region:
a first second-semiconductor layer of a second conductivity type, provided on the first surface of the first semiconductor layer and having a first surface and a second surface that are opposite to each other, the second surface thereof facing the semiconductor substrate;
in the first MOS structure region:
a plurality of first first-semiconductor regions of the first conductivity type, selectively provided in the first second-semiconductor layer at the first surface thereof,
a plurality of first gate insulating films each having a first surface and a second surface that are opposite to each other, the second surface thereof being in contact with the first second-semiconductor layer,
a plurality of first gate electrodes respectively provided on the first surfaces of the first gate insulating films, and
a plurality of first first-electrodes provided on the first surface of the first second-semiconductor layer and surfaces of the first first-semiconductor regions;
in the second MOS structure region:
a second second-semiconductor layer of the second conductivity type, provided on the first surface of the first semiconductor layer and having a first surface and a second surface that are opposite to each other, the second surface thereof facing the semiconductor substrate,
a plurality of second first-semiconductor regions of the first conductivity type, selectively provided in the second second-semiconductor layer at the first surface thereof,
a plurality of second gate insulating films each having a first surface and a second surface that are opposite to each other, the second surface thereof being in contact with the second second-semiconductor layer,
a plurality of second gate electrodes respectively provided on the first surfaces of the second gate insulating films, and
a plurality of second first-electrodes provided on the first surface of the second second-semiconductor layer and surfaces of the second first-semiconductor regions;
in the gate ring region:
an insulating film having a first surface and a second surface that are opposite to each other, the second surface thereof being in contact with the first second-semiconductor layer,
a third gate electrode provided on the first surface of the insulating film, and
a gate wiring electrode provided on the third gate electrode;
in the first ring region:
a third second-semiconductor layer of the second conductivity type, provided on the first surface of the first semiconductor layer, and
a third first-electrode provided on a surface of the third second-semiconductor layer;
in the second ring region:
a fourth second-semiconductor layer of the second conductivity type, provided on the first surface of the first semiconductor layer, and
a fourth first-electrode provided on a surface of the fourth second-semiconductor layer; and
a second electrode provided on the back surface of the semiconductor substrate, wherein
the third first-electrode has a potential thereof equal to that of the second first-electrodes, and
the fourth first-electrode has a potential thereof equal to that of the first first-electrodes.

2. The semiconductor device according to claim 1, wherein
the second second-semiconductor layer and the third second-semiconductor layer are connected to each other, and
the first second-semiconductor layer and the fourth second-semiconductor layer are connected to each other.

3. The semiconductor device according to claim 1, further comprising:
a first short-circuit region electrically connecting the first first-electrodes and the fourth first-electrode; and
a second short-circuit region electrically connecting the second first-electrodes and the third first-electrode.

4. The semiconductor device according to claim 1, further comprising:
a Zener diode region between the gate ring region and the first ring region in the top view, wherein
a part of each of the semiconductor substrate, the first semiconductor layer, the first second-semiconductor layer and the insulating film is formed in the Zener diode region, and
the semiconductor device further includes, in the Zener diode region, a Zener diode provided on the first surface of the insulating film, the Zener diode having a plurality of second semiconductor regions of the second conductivity type and a plurality of third semiconductor regions of the first conductivity type alternately arranged therein, wherein
the Zener diode includes a first Zener diode having a first end thereof electrically connected to the second first-electrodes and a second end thereof electrically connected to the third first-electrode.

5. The semiconductor device according to claim 4, wherein
the Zener diode further includes a second Zener diode having a first end thereof electrically connected to the first first-electrodes and a second end thereof electrically connected to the fourth first-electrode.

6. The semiconductor device according to claim 1, wherein
the plurality of second first-semiconductor regions, the plurality of second gate insulating films, the plurality of second gate electrodes, the plurality of second first-electrodes, and a part of each of the semiconductor substrate, the first semiconductor layer, the second second-semiconductor layer and the second electrode that is in the second MOS structure region, form a second MOS structure, and
the second MOS structure detects overcurrent flowing in the first MOS structure region.

7. The semiconductor device according to claim 1, further comprising:
in the first MOS structure region, a plurality of first trenches that penetrate the first first-semiconductor regions and the first second-semiconductor layer and reach the first semiconductor layer, the first gate electrodes being provided in the first trenches via the first gate insulating films, respectively, and
in the second MOS structure region, a plurality of second trenches that penetrate the second first-semiconductor regions and the second second-semiconductor layer and reach the first semiconductor layer, the second gate electrodes being provided in the second trenches via the second gate insulating films, respectively.

8. The semiconductor device according to claim 1, wherein
each of the semiconductor substrate, the first semiconductor layer and the second electrode is formed in all of the active region, the gate ring region, the first ring region, the second ring, and the termination region.

9. The semiconductor device according to claim 8, wherein
the plurality of first first-semiconductor regions, the plurality of first gate insulating films, the plurality of first gate electrodes, the plurality of first first-electrodes, and a part of each of the semiconductor substrate, the first semiconductor layer, the first second-semiconductor layer and the second electrode that is in the first MOS structure region, form a first MOS structure.

10. The semiconductor device according to claim 8, wherein
the plurality of second first-semiconductor regions, the plurality of second gate insulating films, the plurality of second gate electrodes, the plurality of second first-electrodes, and a part of each of the semiconductor substrate, the first semiconductor layer, the second second-semiconductor layer and the second electrode that is in the second MOS structure region, form a second MOS structure.

* * * * *